United States Patent
Regnier

(10) Patent No.: US 10,797,451 B2
(45) Date of Patent: *Oct. 6, 2020

(54) THERMALLY EFFICIENT CONNECTOR SYSTEM

(71) Applicant: Molex, LLC, Lisle, IL (US)

(72) Inventor: Kent E. Regnier, Lombard, IL (US)

(73) Assignee: Molex, LLC, Lisle, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/531,725

(22) Filed: Aug. 5, 2019

(65) Prior Publication Data

US 2019/0356093 A1 Nov. 21, 2019

Related U.S. Application Data

(63) Continuation of application No. 15/966,141, filed on Apr. 30, 2018, now Pat. No. 10,374,372, which is a
(Continued)

(51) Int. Cl.
*H01R 25/00* (2006.01)
*H01R 12/72* (2011.01)
(Continued)

(52) U.S. Cl.
CPC ....... *H01R 25/006* (2013.01); *H01R 12/7005* (2013.01); *H01R 12/721* (2013.01);
(Continued)

(58) Field of Classification Search
CPC .............. H01R 25/006; H01R 12/7005; H01R 12/721; H01R 12/724; H01R 13/6587; H01R 13/6594
(Continued)

(56) References Cited

U.S. PATENT DOCUMENTS 5,767,999 A * 6/1998 Kayner ................. G06F 13/409
398/164
6,062,893 A * 5/2000 Miskin ................. H01R 12/722
439/374
(Continued)

FOREIGN PATENT DOCUMENTS

| CN | 102403602 A | 4/2012 |
|---|---|---|
| JP | H10-189178 A | 7/1998 |
| JP | 2001-118629 A | 4/2001 |

OTHER PUBLICATIONS

Non-Final Office action received for U.S. Appl. No. 15/109,862, dated Mar. 28, 2017, 19 pages.
(Continued)

*Primary Examiner* — Peter G Leigh
(74) *Attorney, Agent, or Firm* — Molex, LLC

(57) ABSTRACT

A connector assembly can be provided. A receptacle includes terminals that can be positioned in a card slot on a 0.60 mm pitch (or greater). A biasing element can be provided in the card slot to engage a mating paddle card. The receptacle can be configured to allow air to flow from a front face to a rear face, the air passing through a middle wall. A plug assembly can be provided that includes a conductive body and is configured to generate some amount of heat. The body can include a surface that has cooling grooves. The cooling grooves allow air flow over the plug assembly so that the plug assembly can be cooled directly.

10 Claims, 24 Drawing Sheets

Related U.S. Application Data continuation of application No. 15/109,862, filed as application No. PCT/US2015/022705 on Mar. 26, 2015, now Pat. No. 9,960,553.

(60) Provisional application No. 61/971,366, filed on Mar. 27, 2014.

(51) Int. Cl.
| | |
|---|---|
| *H01R 13/6587* | (2011.01) |
| *H01R 13/6594* | (2011.01) |
| *H01R 12/70* | (2011.01) |
| *H05K 7/20* | (2006.01) |
| *H01R 13/717* | (2006.01) |

(52) U.S. Cl.
CPC ....... *H01R 12/724* (2013.01); *H01R 13/6587* (2013.01); *H01R 13/6594* (2013.01); *H05K 7/20127* (2013.01); *H01R 13/7172* (2013.01)

(58) Field of Classification Search
USPC .......................................... 439/458
See application file for complete search history.

(56) References Cited

U.S. PATENT DOCUMENTS

| | | | |
|---|---|---|---|
| 6,178,096 B1 * | 1/2001 | Flickinger ............ | H05K 9/0058 206/719 |
| 6,431,765 B1 | 8/2002 | Chen et al. | |
| 6,483,711 B1 | 11/2002 | Huang | |
| 6,722,908 B2 | 4/2004 | Llapitan et al. | |
| 6,811,326 B2 * | 11/2004 | Keeble ................ | G02B 6/4201 385/92 |
| 6,811,413 B2 | 11/2004 | Keeble et al. | |
| 6,830,383 B2 | 12/2004 | Huang | |
| 6,870,746 B2 * | 3/2005 | Leeson ................ | H05K 9/0058 361/816 |
| 7,013,088 B1 | 3/2006 | Jiang et al. | |
| 7,023,703 B2 * | 4/2006 | Peloza ................ | G02B 6/4201 361/727 |
| 7,066,762 B2 * | 6/2006 | Neer .................... | G02B 6/4292 439/347 |
| 7,070,446 B2 | 7/2006 | Henry et al. | |
| 7,195,403 B2 * | 3/2007 | Oki ...................... | G02B 6/4201 361/728 |
| 7,227,751 B2 | 6/2007 | Robbins et al. | |
| 7,281,862 B2 * | 10/2007 | Oen .................... | G02B 6/4201 385/88 |
| 7,306,381 B2 | 12/2007 | Yu et al. | |
| 7,371,965 B2 | 5/2008 | Ice | |
| 7,381,077 B2 * | 6/2008 | Chen .................... | G02B 6/4201 439/350 |
| 7,425,098 B2 * | 9/2008 | Meadowcroft ....... | G02B 6/4201 361/816 |
| 7,484,987 B2 | 2/2009 | Ice | |
| 7,543,995 B2 | 6/2009 | Ice | |
| 7,547,149 B2 | 6/2009 | Ice | |
| 7,597,573 B2 | 10/2009 | Defibaugh et al. | |
| 7,646,615 B2 | 1/2010 | Ice | |
| 7,704,097 B1 | 4/2010 | Phillips et al. | |
| 7,764,504 B2 | 7/2010 | Phillips et al. | |
| 7,896,659 B1 | 3/2011 | Westman et al. | |
| 7,914,317 B2 * | 3/2011 | Pirillis ................ | H05K 5/0204 439/372 |
| 7,974,098 B2 | 7/2011 | Oki et al. | |
| 8,035,973 B2 | 10/2011 | McColloch | |
| 8,177,579 B2 | 5/2012 | Tai et al. | |
| 8,277,252 B2 * | 10/2012 | Fogg .................. | H01R 13/6587 439/607.25 |
| 8,345,426 B2 * | 1/2013 | Nichols ................ | H05K 7/1418 165/80.2 |
| 8,393,916 B2 | 3/2013 | Yu et al. | |
| 8,393,917 B2 | 3/2013 | Regnier | |
| 8,534,930 B1 | 9/2013 | Lima | |
| 8,535,787 B1 | 9/2013 | Lima | |
| 8,540,525 B2 | 9/2013 | Regnier et al. | |
| 8,545,268 B2 * | 10/2013 | Fogg .................. | H01R 13/6587 439/607.25 |
| 8,613,632 B1 | 12/2013 | Nichols | |
| 8,803,832 B2 | 8/2014 | Ohashi et al. | |
| 9,391,407 B1 | 7/2016 | Bucher et al. | |
| 9,518,785 B2 | 12/2016 | Szczesny | |
| 9,960,553 B2 | 5/2018 | Regnier | |
| 2002/0197043 A1 * | 12/2002 | Hwang ................ | H01R 13/659 385/134 |
| 2003/0169581 A1 | 9/2003 | Bright et al. | |
| 2003/0171033 A1 | 9/2003 | Bright et al. | |
| 2005/0041933 A1 * | 2/2005 | Meadowcroft ...... | G02B 6/4201 385/92 |
| 2006/0003632 A1 | 1/2006 | Long | |
| 2006/0098924 A1 * | 5/2006 | Anderl ................ | H04B 10/806 385/92 |
| 2006/0281357 A1 | 12/2006 | Chen et al. | |
| 2008/0014785 A1 | 1/2008 | Iida et al. | |
| 2008/0137306 A1 | 6/2008 | Kim | |
| 2008/0299826 A1 | 12/2008 | Cheng et al. | |
| 2009/0137152 A1 * | 5/2009 | Tanaka ................ | G06K 7/0047 439/607.22 |
| 2009/0253286 A1 * | 10/2009 | Tanaka ................ | H01R 13/035 439/329 |
| 2009/0296351 A1 | 12/2009 | Oki et al. | |
| 2010/0111476 A1 | 5/2010 | Shirk et al. | |
| 2012/0058670 A1 | 3/2012 | Regnier et al. | |
| 2012/0083156 A1 * | 4/2012 | Fogg .................. | H01R 13/6477 439/607.25 |
| 2012/0322308 A1 | 12/2012 | Fogg et al. | |
| 2012/0329325 A1 * | 12/2012 | Fogg .................. | H01R 13/6477 439/607.25 |
| 2013/0017733 A1 | 1/2013 | Kirk et al. | |
| 2013/0077254 A1 | 3/2013 | Nguyen | |
| 2013/0157499 A1 | 6/2013 | Crippen et al. | |
| 2013/0303025 A1 | 11/2013 | Faith et al. | |
| 2014/0017946 A1 | 1/2014 | Koyama et al. | |
| 2014/0024244 A1 | 1/2014 | Fogg et al. | |
| 2016/0149324 A1 | 5/2016 | Regnier | |
| 2017/0005446 A1 | 1/2017 | Regnier | |

OTHER PUBLICATIONS

Notice of Allowance received for U.S. Appl. No. 15/109,862, dated Dec. 29, 2017, 10 pages.
Non-Final Office action received for U.S. Appl. No. 15/966,141, dated Jun. 28, 2018, 15 pages.
Notice of Allowance received for U.S. Appl. No. 15/966,141, dated Nov. 29, 2018, 9 pages.
International Search Report Received for PCT Application No. PCT/US2015/022705, dated Jun. 30, 2015, 11 pages.
International Preliminary Report on Patentability Received for PCT Application No. PCT/US2015/022705, dated Oct. 6, 2016, 10 pages.
Office Action Received for European Patent Application No. 15768390.5, dated Nov. 29, 2018, 8 pages.
Notice of Allowance received for U.S. Appl. No. 15/966,141, dated Mar. 29, 2019, 10 pages.

* cited by examiner

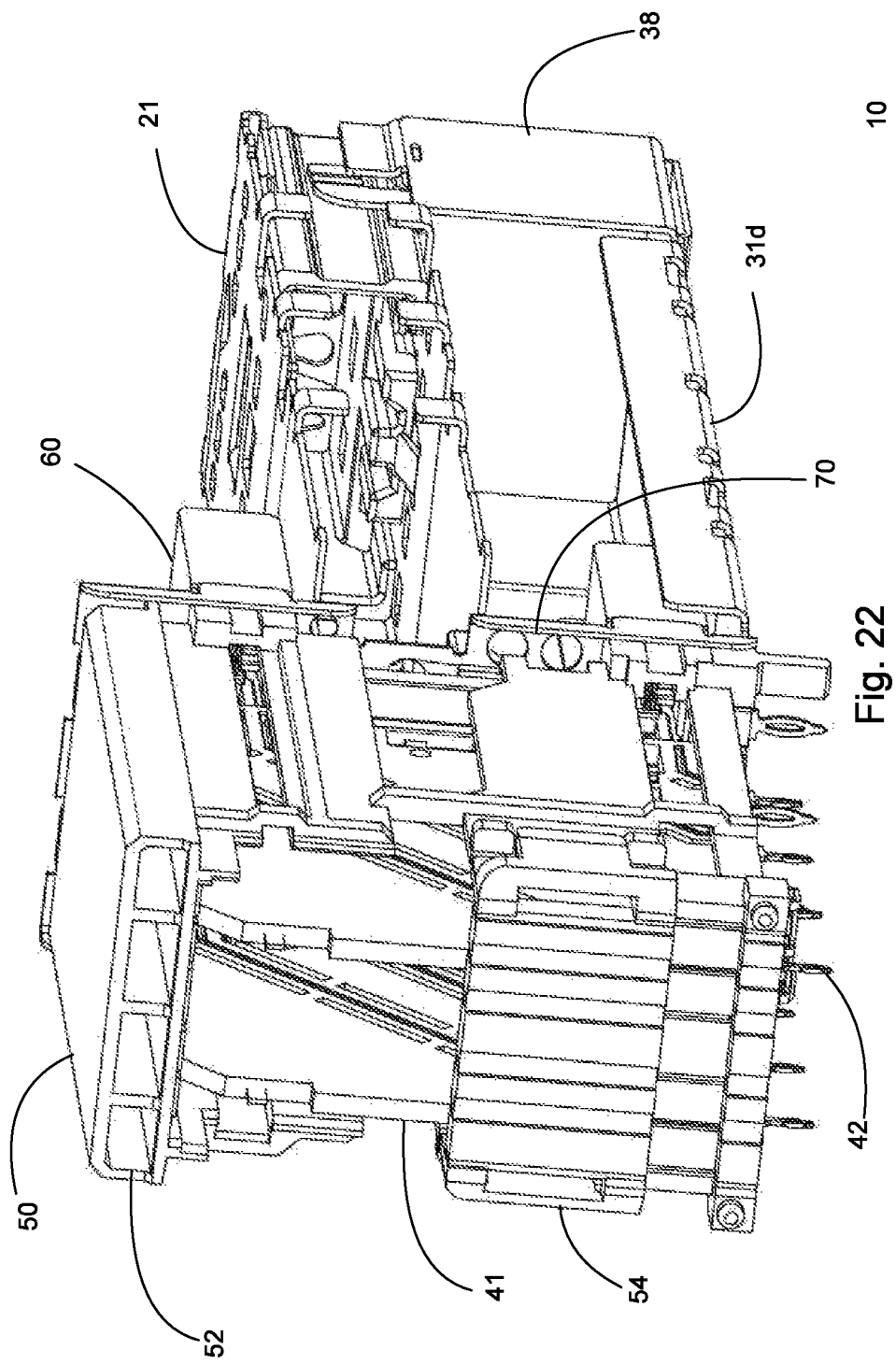

THERMALLY EFFICIENT CONNECTOR SYSTEM

RELATED APPLICATIONS

This application is a continuation of U.S. application Ser. No. 15/966,141, filed Apr. 30, 2018, now U.S. Pat. No. 10,374,372, which is a continuation of U.S. application Ser. No. 15/109,862, filed Jul. 6, 2016, now U.S. Pat. No. 9,960,553, which is a national phase of PCT Application No. PCT/US2015/022705, filed Mar. 26, 2015, which claims priority to U.S. Provisional Application No. 61/971,366, filed Mar. 27, 2014, all of which are incorporated herein by reference in their entirety.

TECHNICAL FIELD

This disclosure relates to field of connectors, more specifically to connectors suitable for supporting increasing needs for density.

DESCRIPTION OF RELATED ART

Input/Output (I/O) connectors are well known. Some of the common types include SFP, QSFP and CXP style connectors. One way these connectors tend to be used is a rack mounted switch so that a number of connections can be provided to other devices and high band width requirements can be supported. These connectors, while useful, tend to be configured to provide terminals in a card slot at a 0.8 or 0.75 pitch. Each card slot can have terminals on two sides of the card slot. Thus, the pitch the terminals are positioned on tends to limit the number of terminals that be provided in row and thus limits the bandwidth that can be supported by a 1U rack system. While IO connectors with small pitches are known, conventional IO connectors that use a paddle card in a plug connector (e.g., SFP, QSFP, CXP) are at 0.75 mm or larger pitch so as to accommodate the tolerances inherent in the paddle card that is inserted into the card slot (as the paddle card is typically formed with a PCB construction). Removing the paddle card could potentially help improve tolerance stack-up but the paddle card is desirable as it can support circuitry that allows the system to work, particularly for active copper and optical based plug assemblies.

It has been determined that when attempting to provide a card slot with terminal at 0.65 mm or less the tolerances of the circuit board that are used to form a paddle card become problematic if conventional construction techniques are used. One approach to help resolve this issue has been to use a biasing element in a cage that help bias the plug connector toward one side of a port. However, certain individuals would appreciate further improvements to a connector system.

In addition, existing systems tend to be difficult to cool, especially if the systems are arranged in a stacked configuration. Thus, certain individuals would appreciate a connector system that could help address thermal management issues.

SUMMARY

A connector is provided that has terminals in a card slot arranged in a pitch of 0.6 mm-0.65 mm (e.g., between 0.59 and 0.66). A biasing member is provided on one end of the card slot to provide sufficient tolerance control. The connector can be configured so as to support active cable assemblies and optical modules (e.g., modules that create a thermal load) and in an embodiment can support modules that generate 2 watts of power. To provide cooling in a stacked configuration, air flow is directed through the connector, over the module and out the back of the connector so that the module can be cooled directly with air flowing through the system.

BRIEF DESCRIPTION OF THE DRAWINGS

The present invention is illustrated by way of example and not limited in the accompanying figures in which like reference numerals indicate similar elements and in which:

FIG. 22 illustrates another perspective view of the embodiment depicted in FIG. 20.

DETAILED DESCRIPTION

Figure 1:
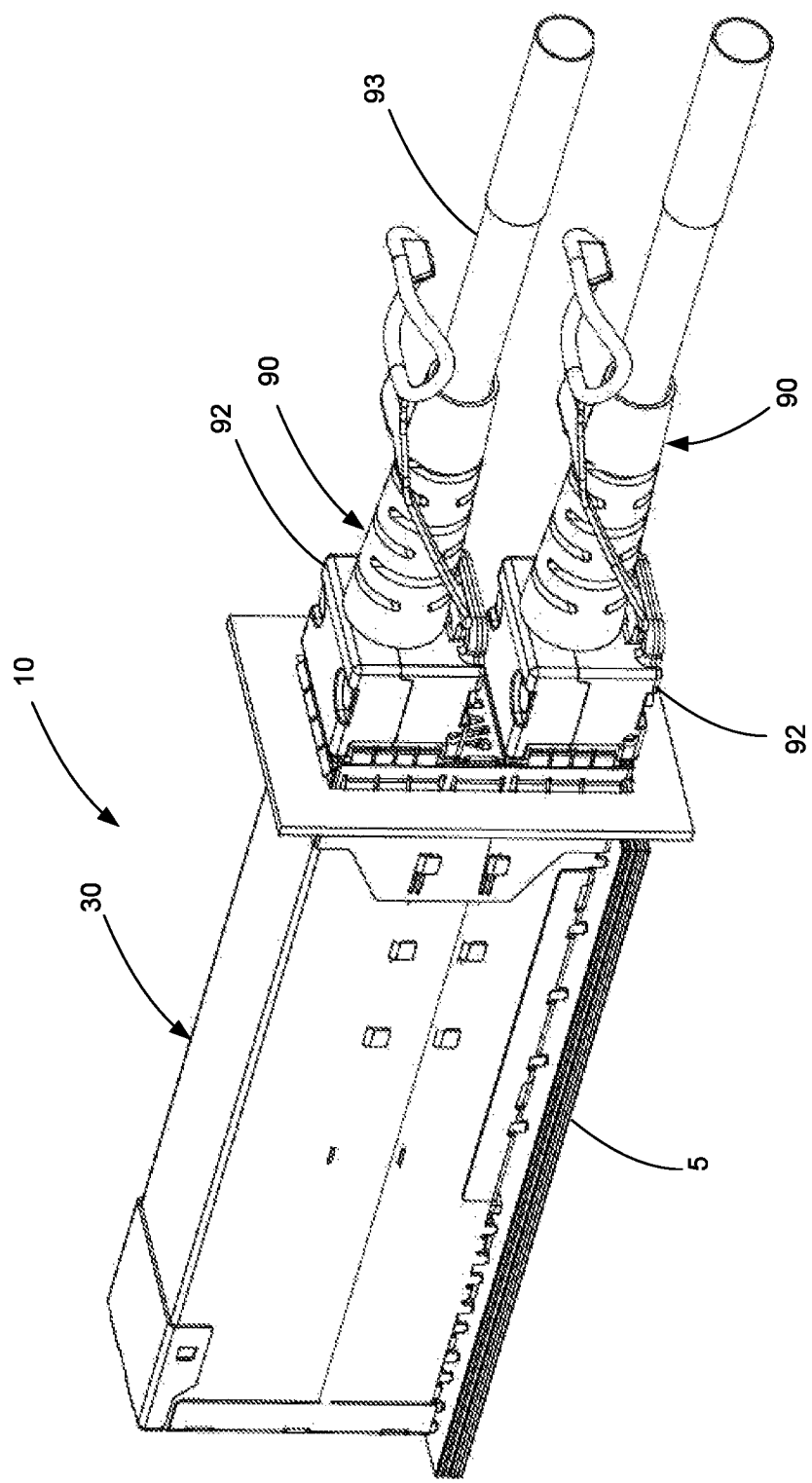
FIG. 1 illustrates a perspective view of an embodiment of a receptacle assembly mated to a plug assembly.
Figure 2:
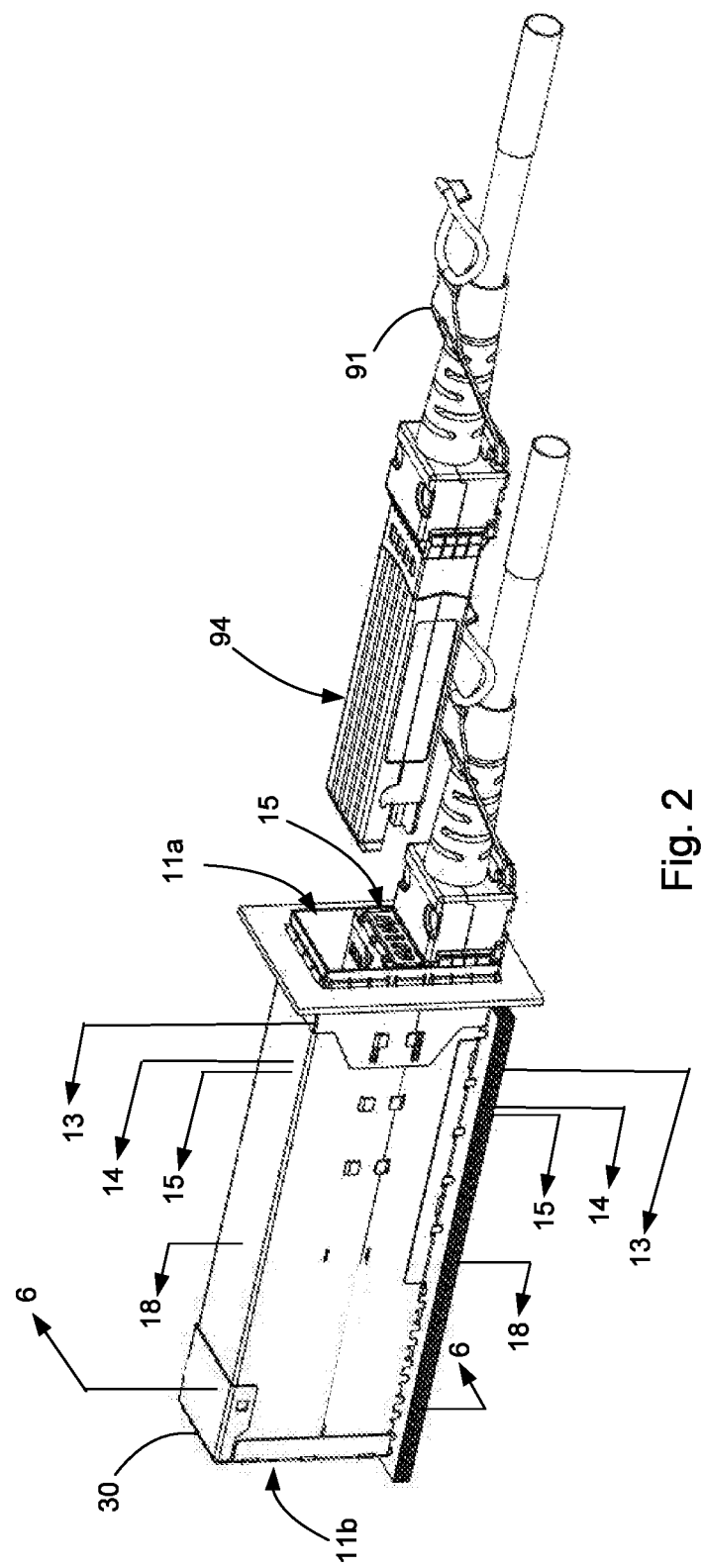
FIG. 2 illustrates a perspective view of the embodiment depicted in FIG. 1 with one of the plug assemblies in an unmated state.
Figure 3:
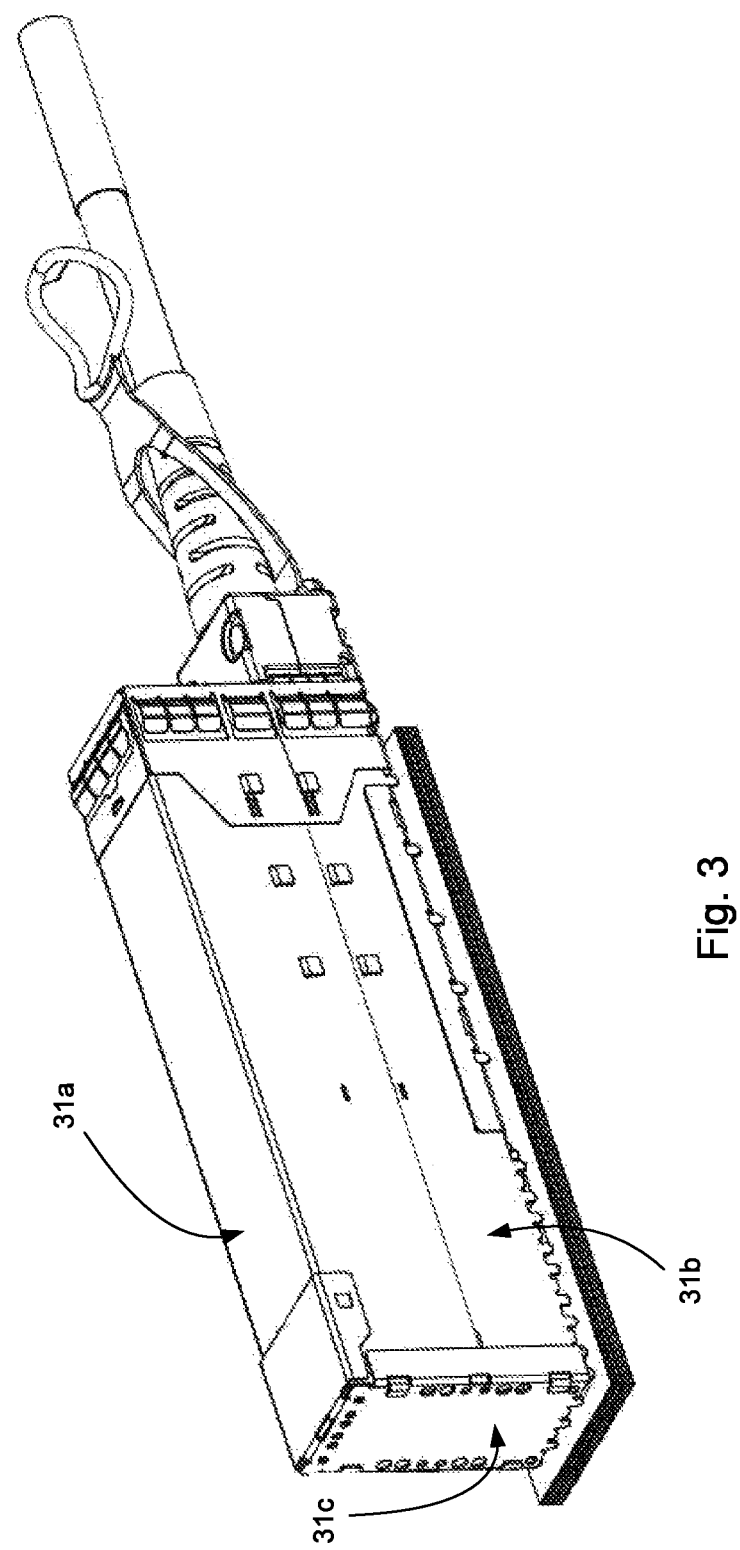
FIG. 3 illustrates another perspective view of the embodiment depicted in FIG. 1 with one of the plug assemblies omitted.
Figure 4:
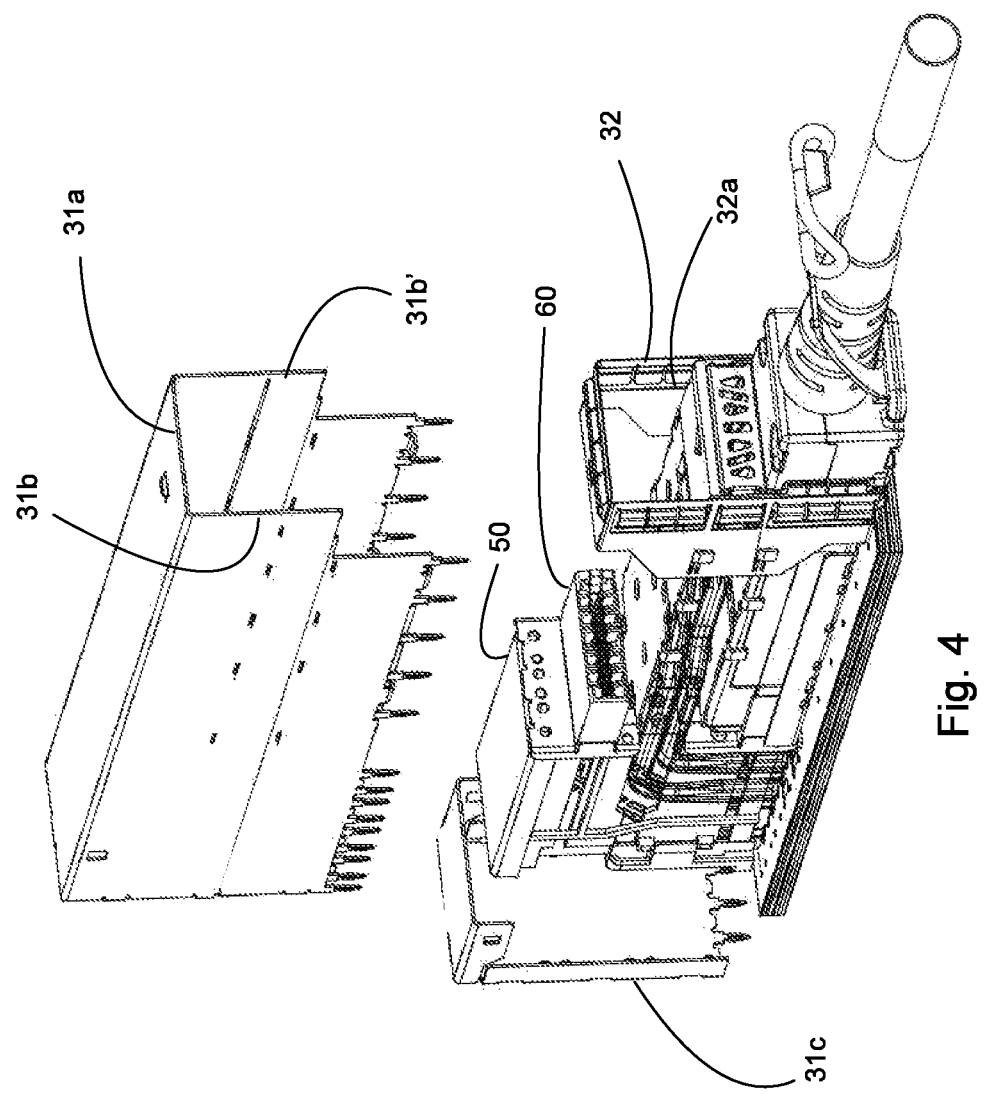
FIG. 4 illustrates a partially exploded perspective view of the embodiment depicted in FIG. 3.
Figure 5:
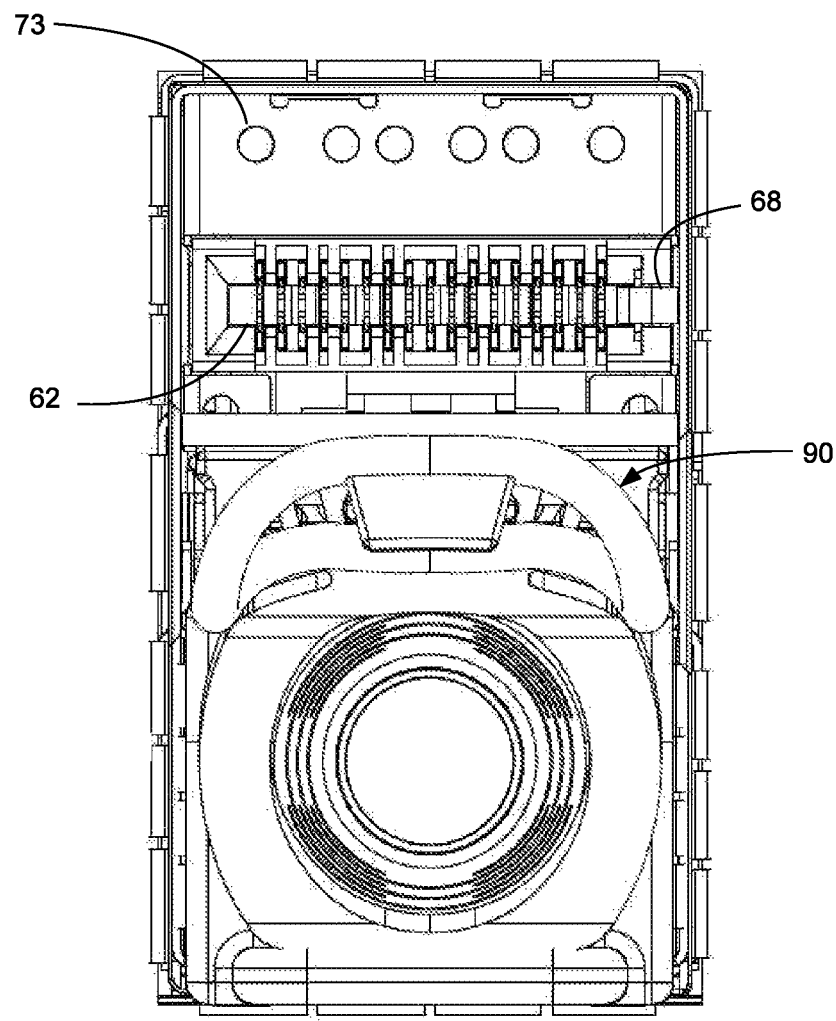
FIG. 5 illustrates an elevated front view of the embodiment depicted in FIG. 3.
Figure 6:
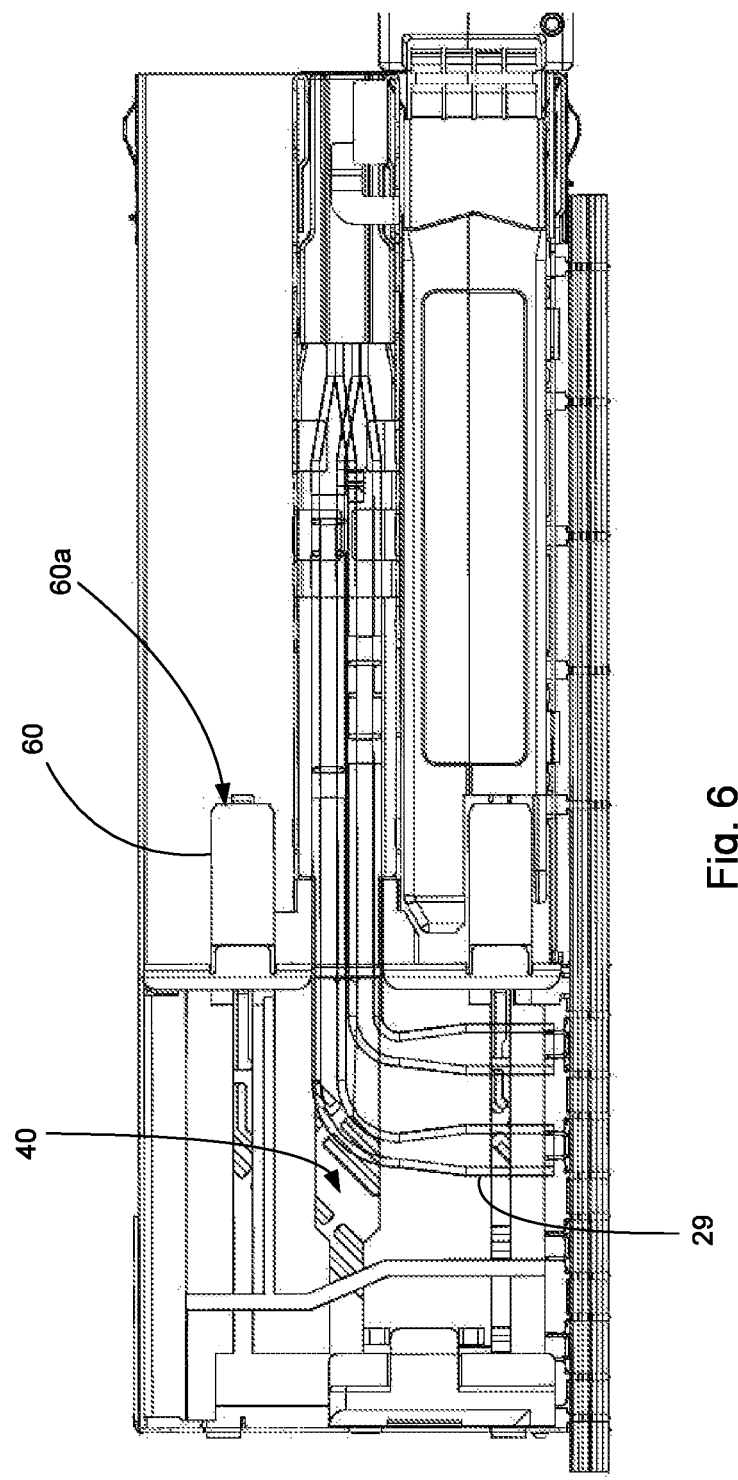
FIG. 6 illustrates an elevated side view of the sectional taken along line 6-6 in FIG. 2.
Figure 7:
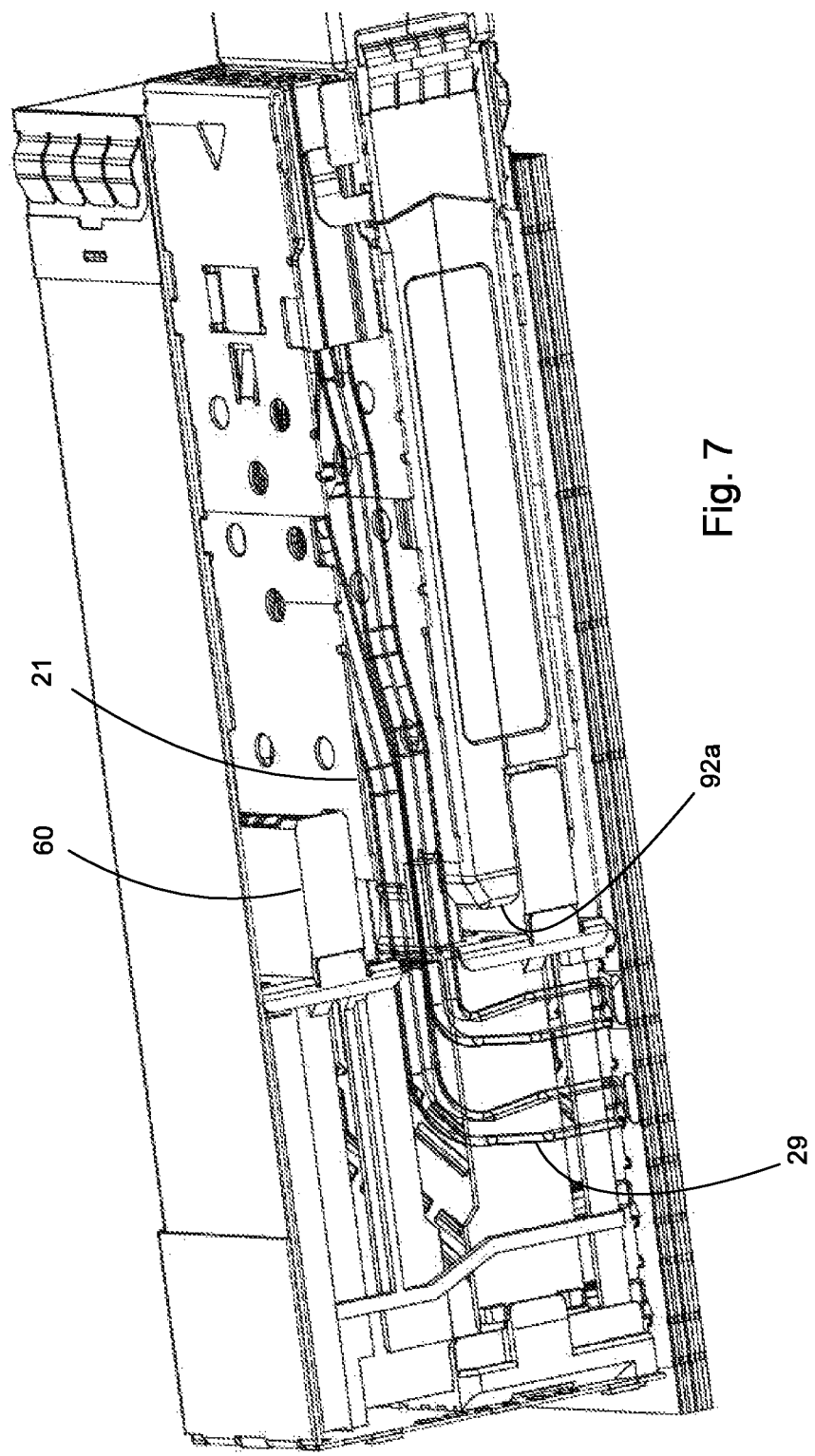
FIG. 7 illustrates a perspective view of the embodiment depicted in FIG. 6.
Figure 8:
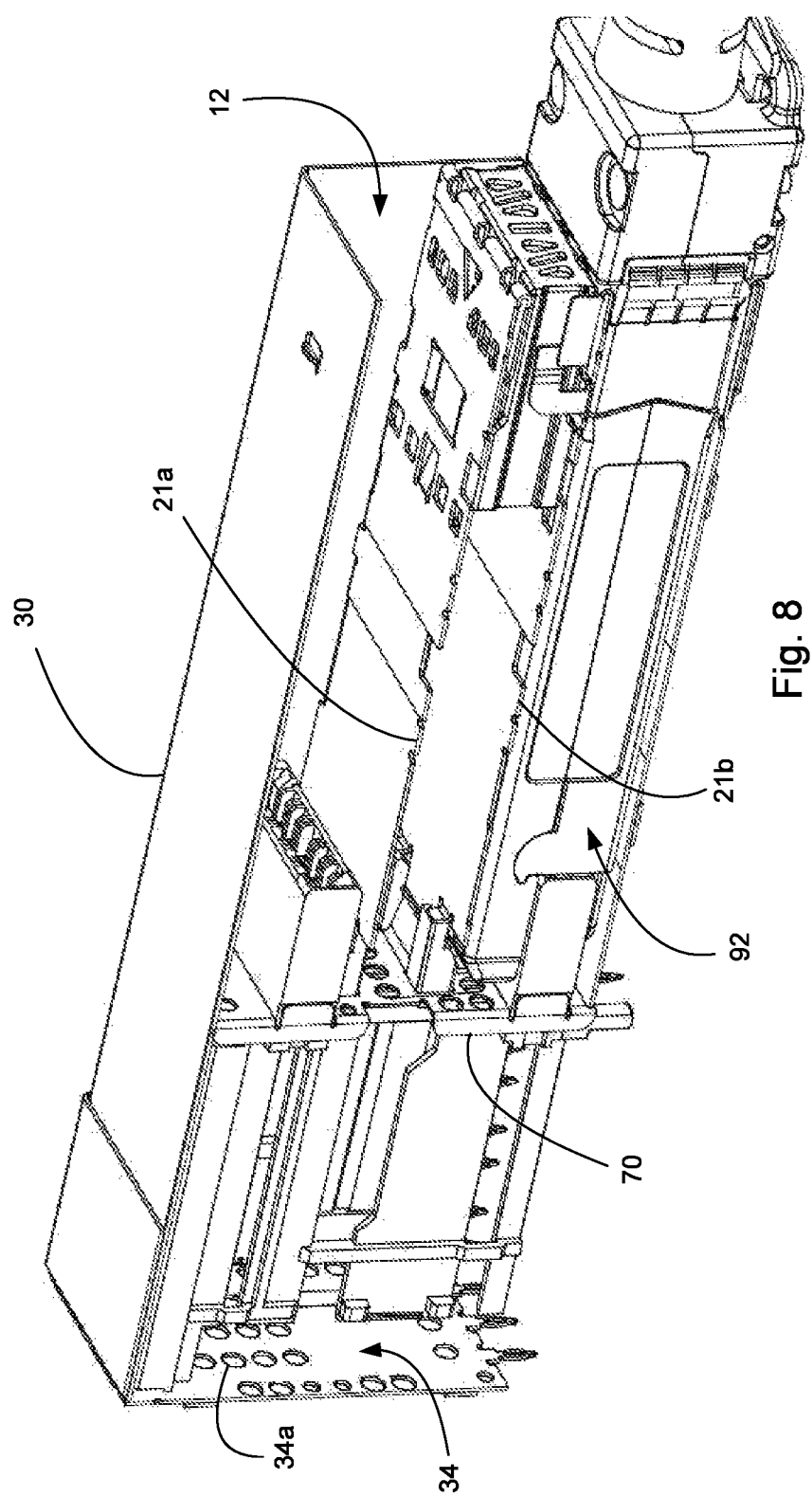
FIG. 8 illustrates a simplified perspective view of the embodiment depicted in FIG. 7.
Figure 9:
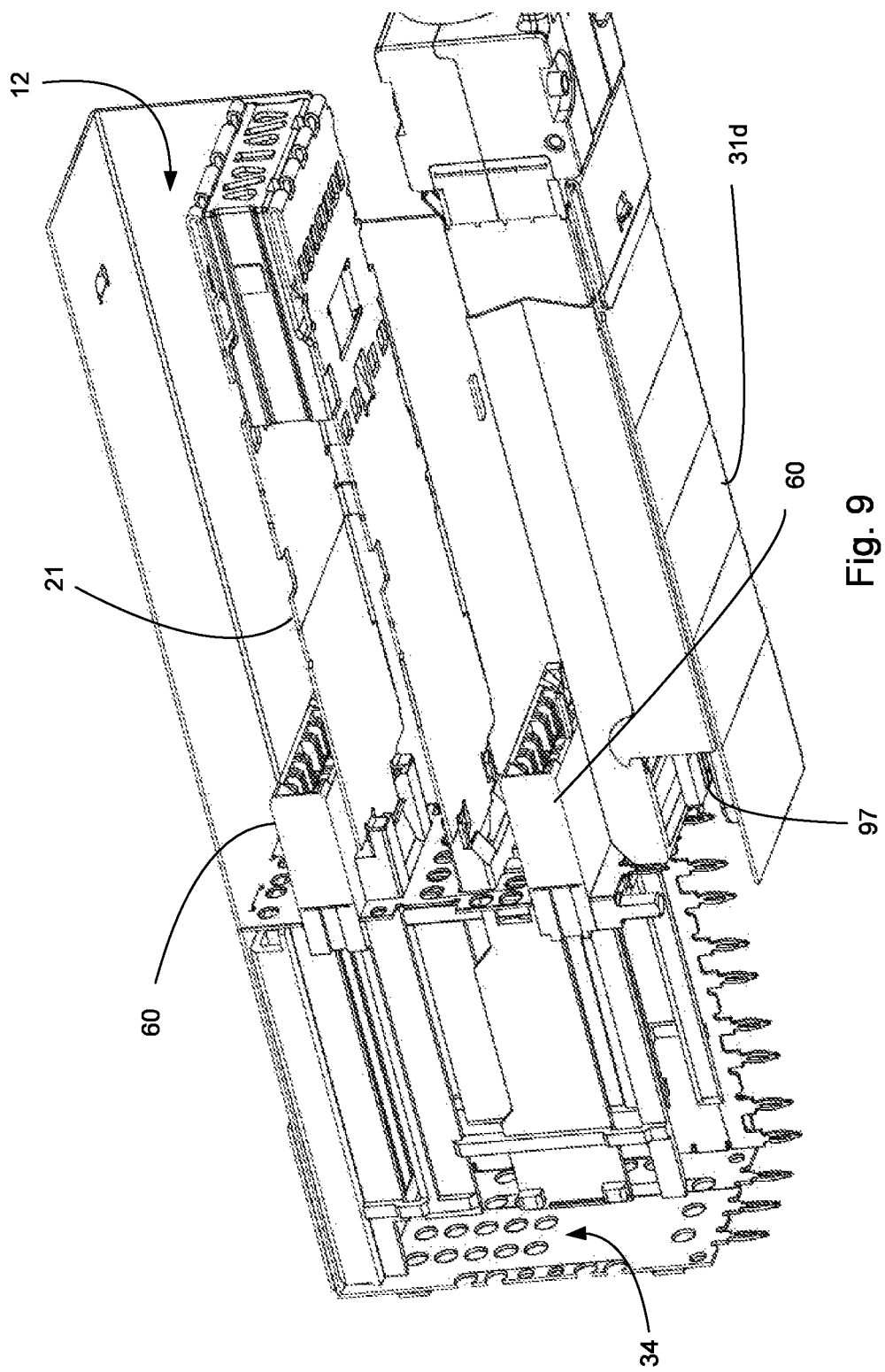
FIG. 9 illustrates a partially exploded perspective view of the embodiment depicted in FIG. 8.
Figure 10:
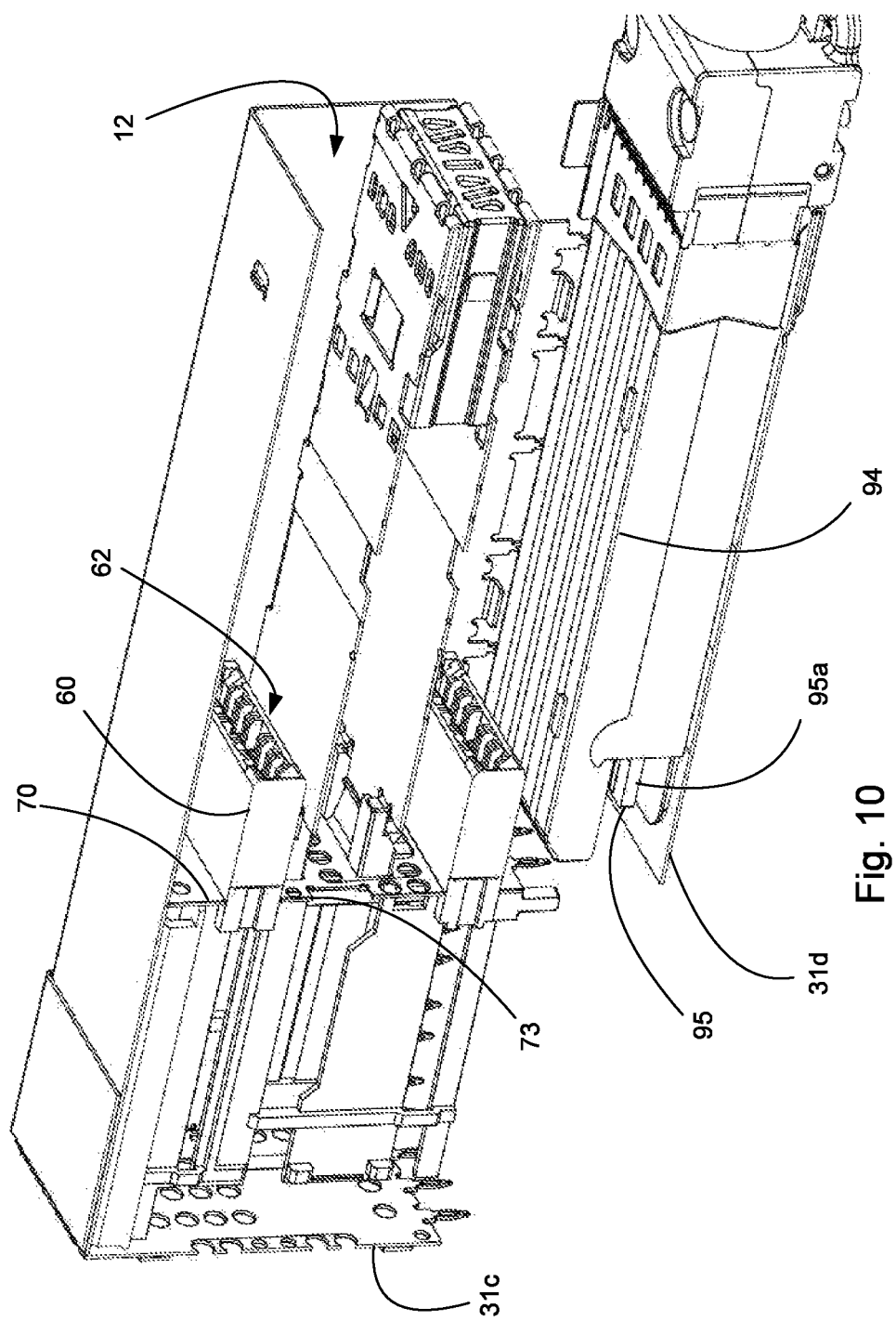
FIG. 10 illustrates another perspective view of the embodiment depicted in FIG. 9.
Figure 11:
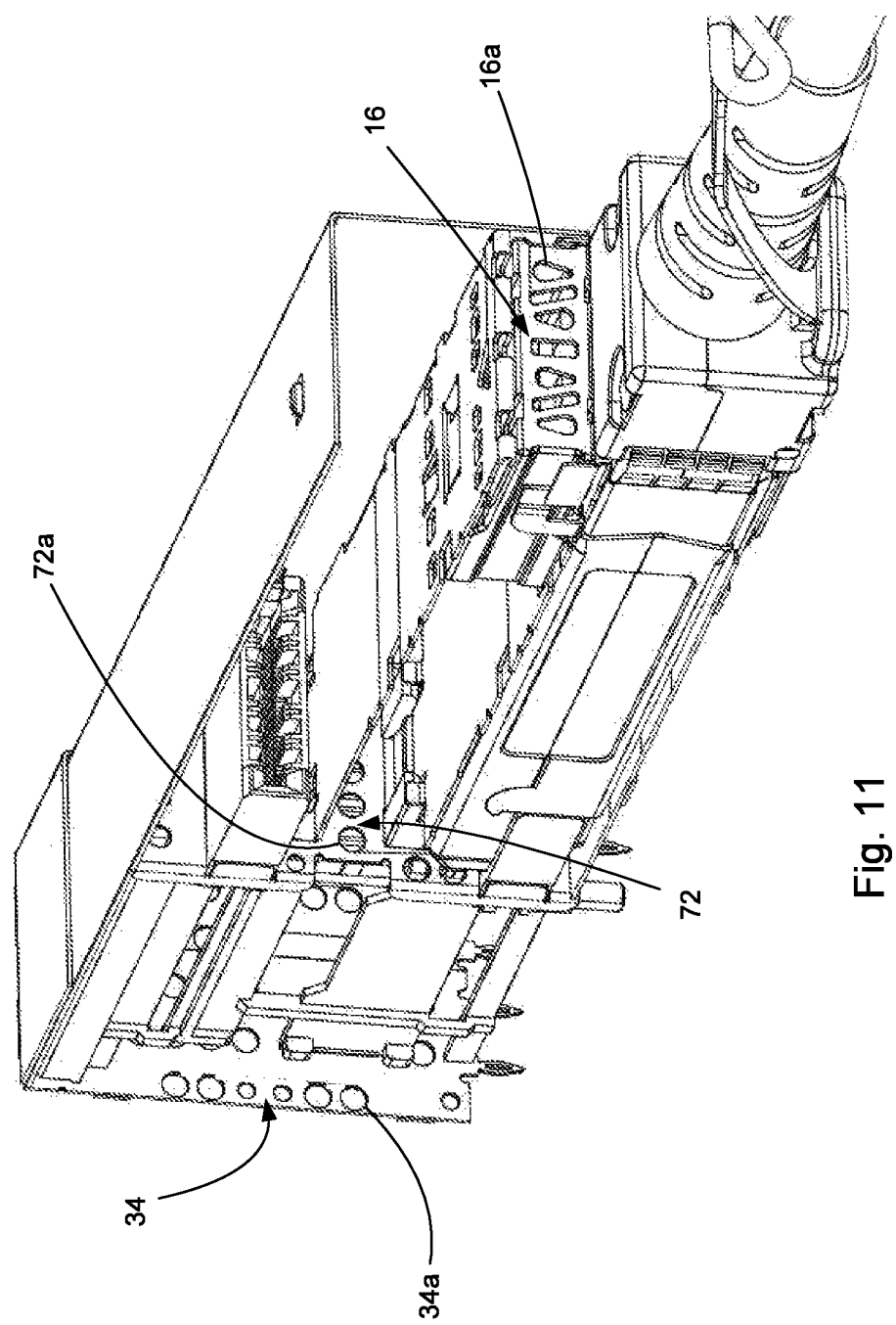
FIG. 11 illustrates another perspective view of the embodiment depicted in FIG. 8.
Figure 12:
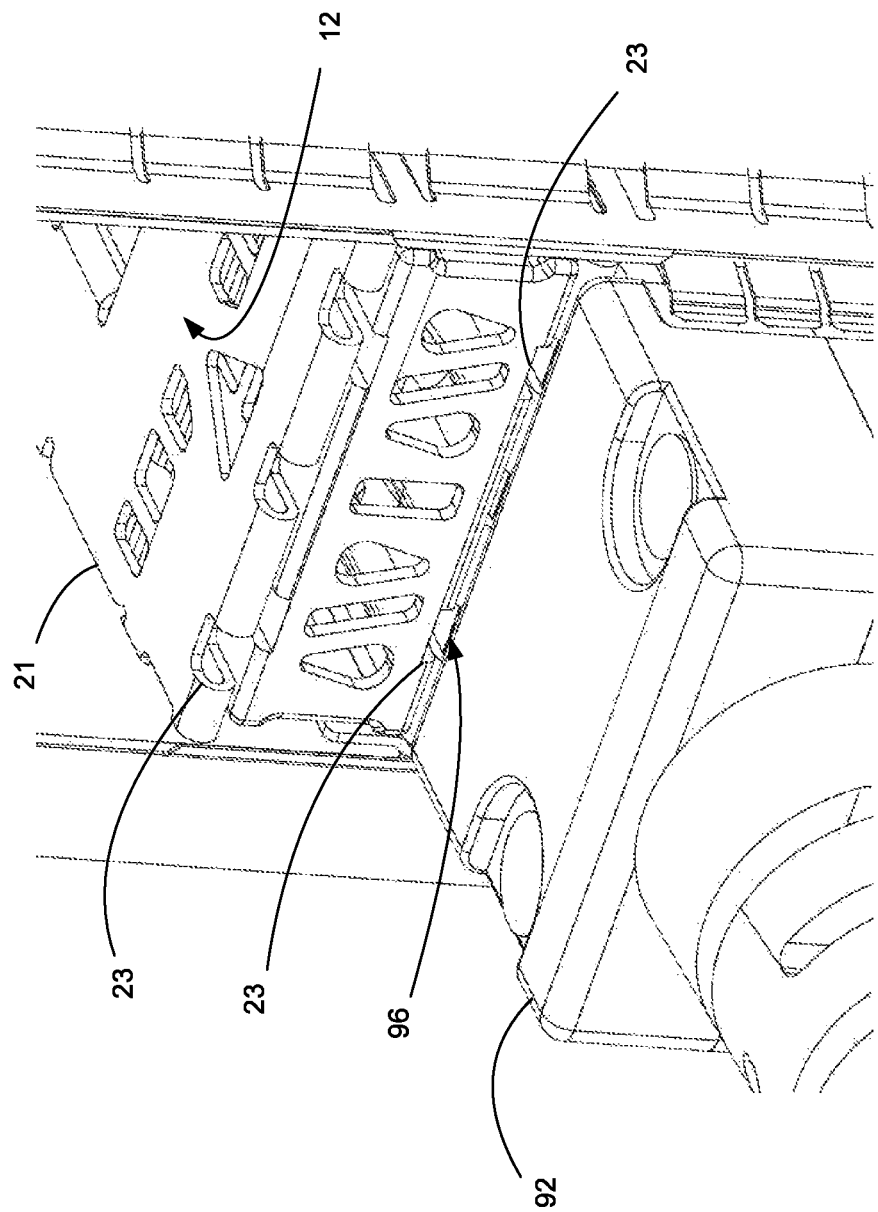
FIG. 12 illustrates an enlarged perspective view of the embodiment depicted in FIG. 2.
Figure 13:
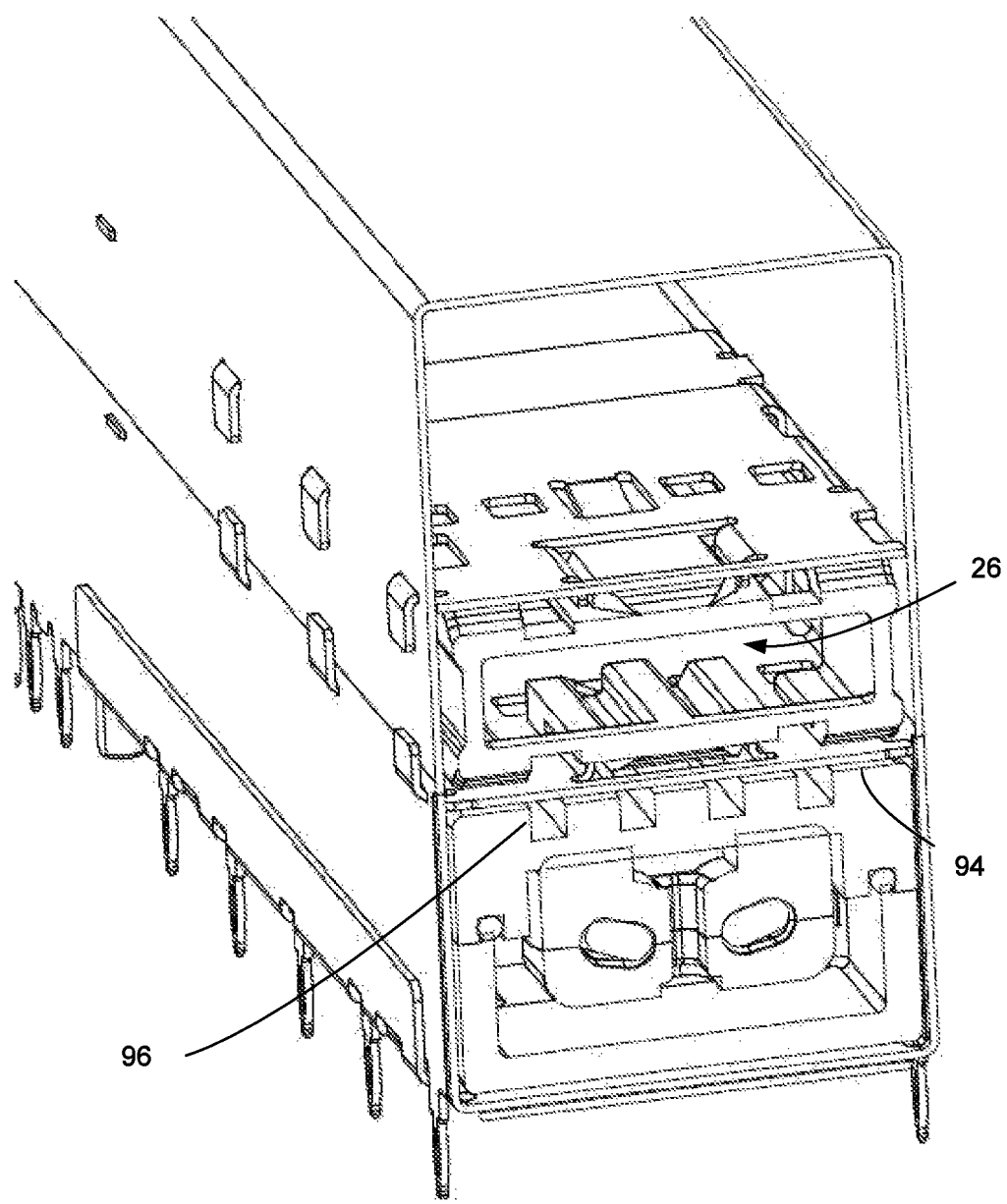
FIG. 13 illustrates a perspective view of the sectional taken along line 13-13 in FIG. 2.
Figure 14:
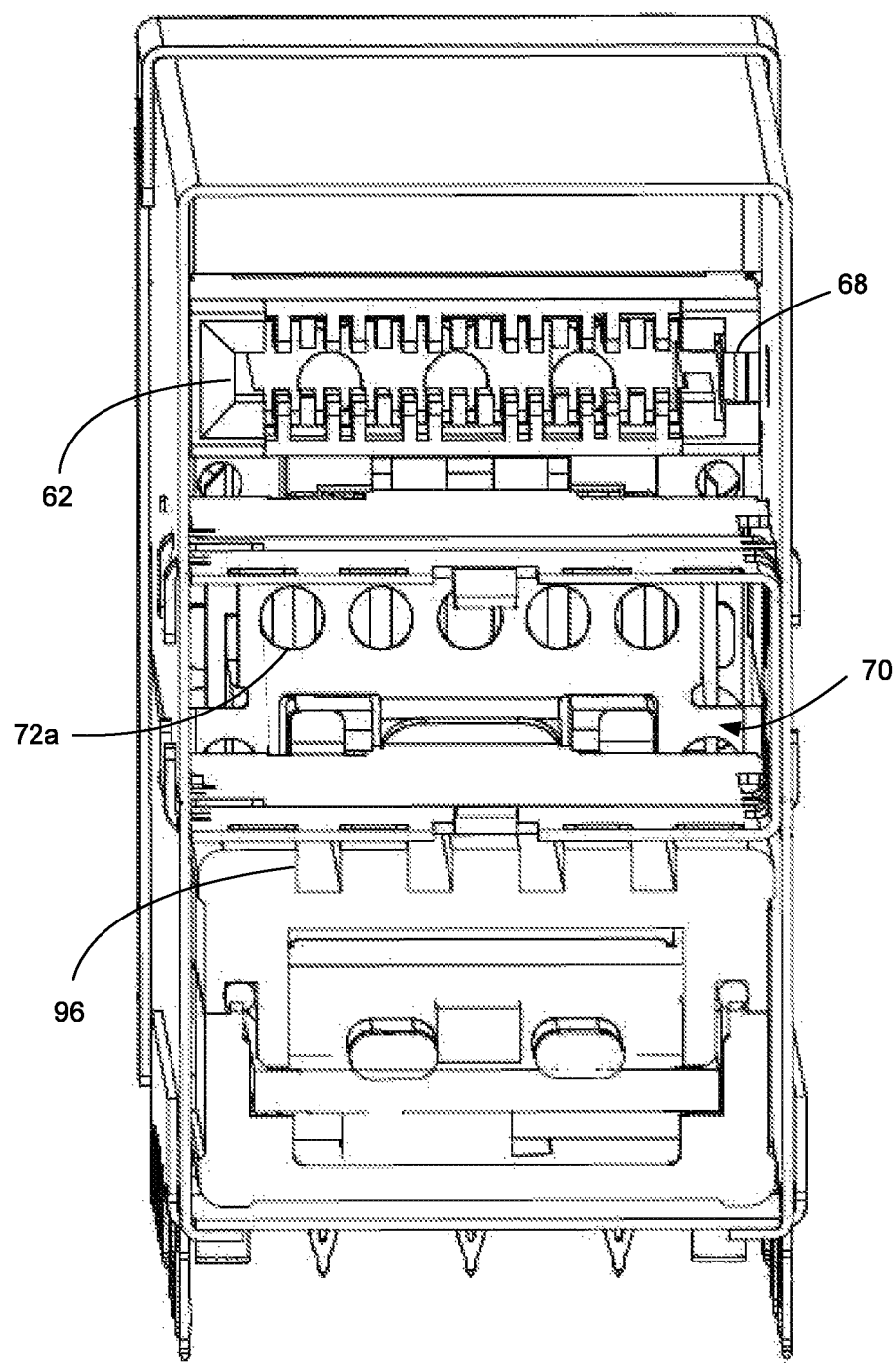
FIG. 14 illustrates a perspective view of the sectional taken along line 14-14 in FIG. 2.
Figure 15:
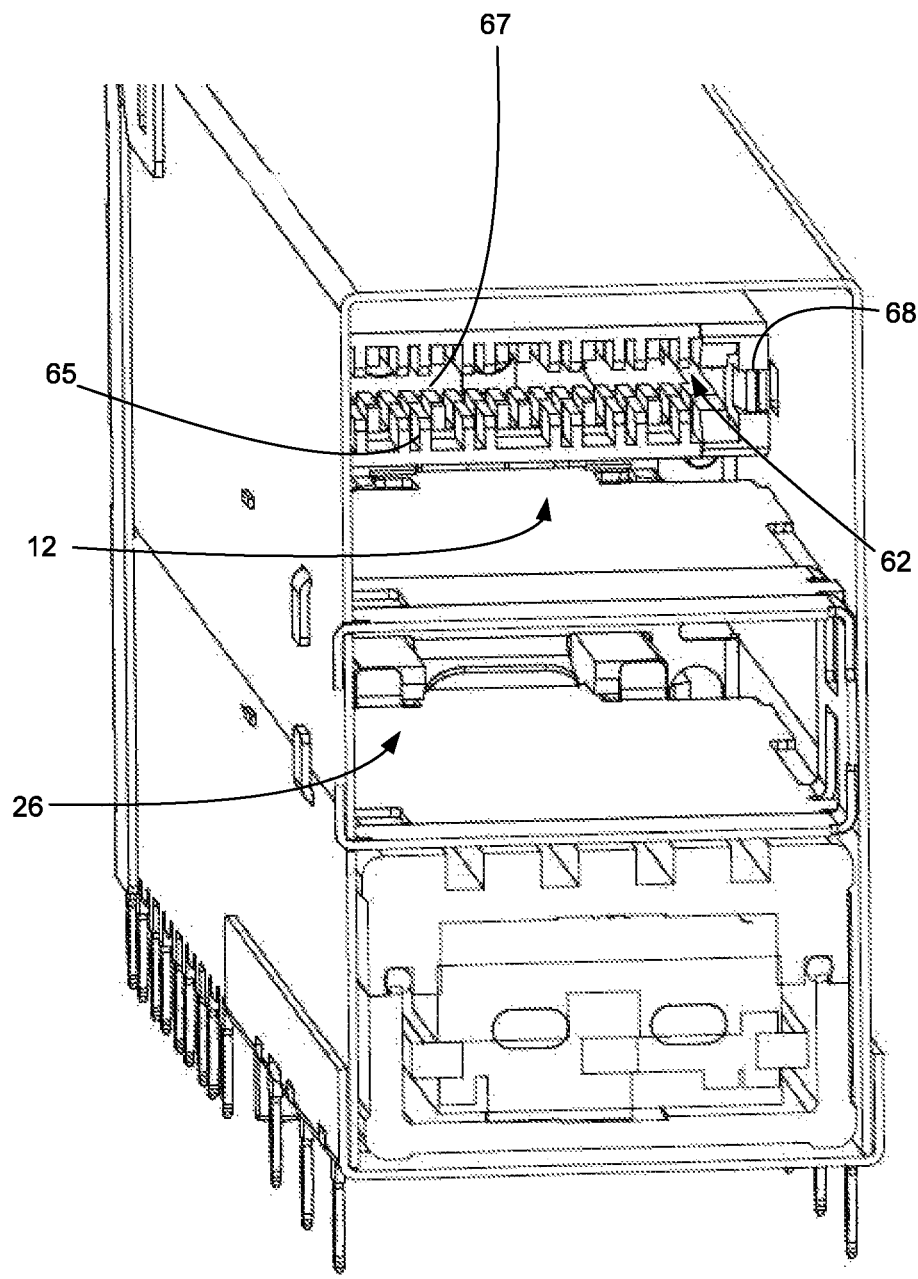
FIG. 15 illustrates a perspective view of the sectional taken along line 15-15 in FIG. 2.
Figure 16A:
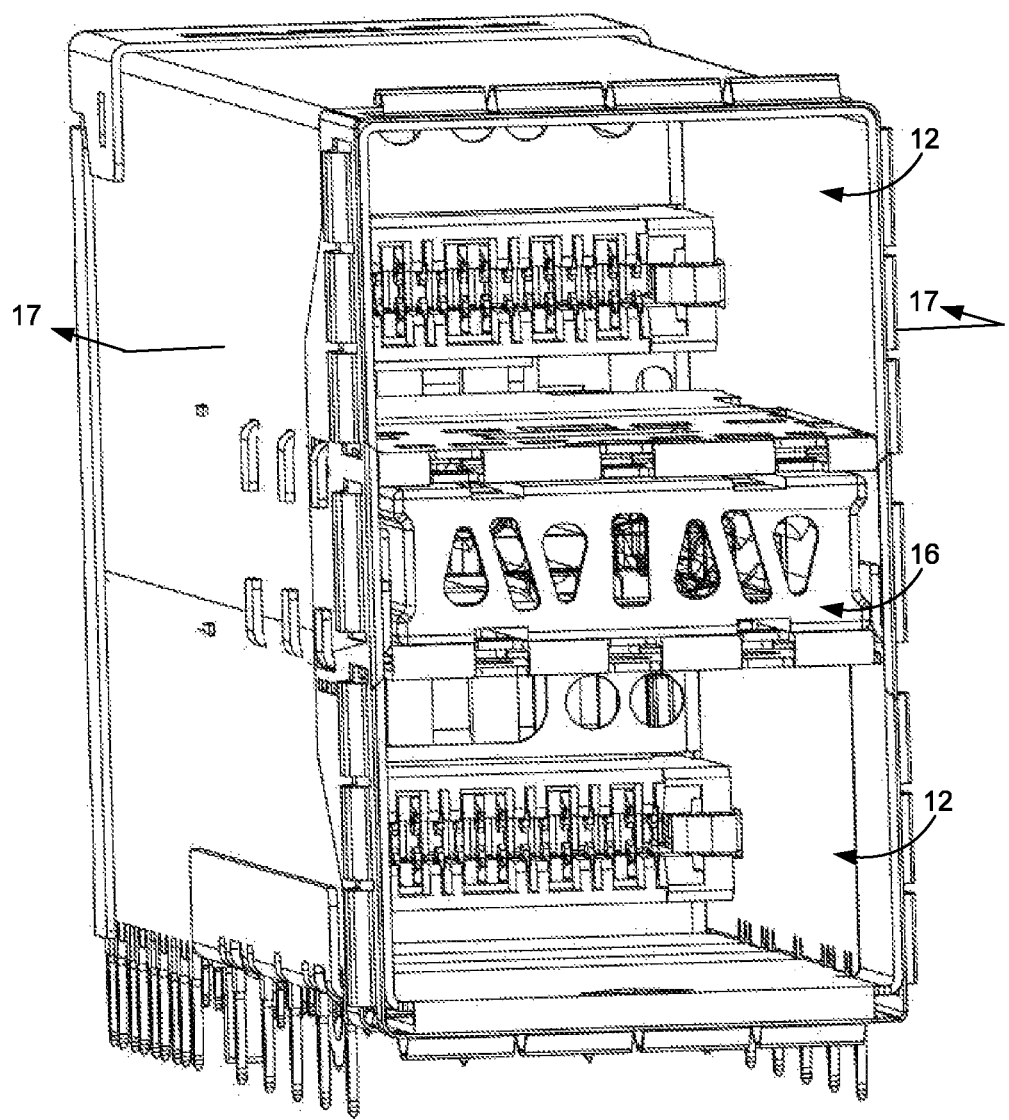
FIG. 16A illustrates a perspective view of another embodiment of a receptacle assembly.
Figure 16B:
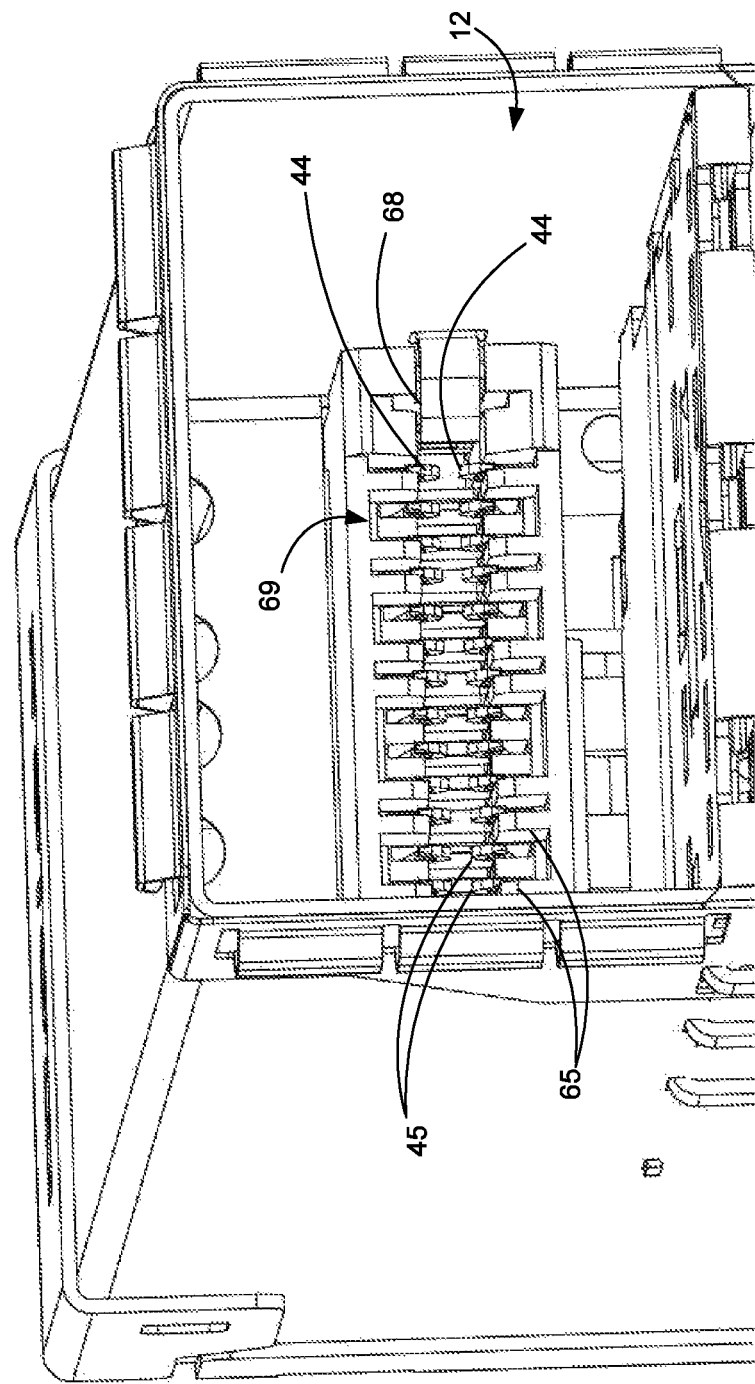
FIG. 16B illustrates an enlarged perspective view of the embodiment depicted in FIG. 16A.
Figure 17A:
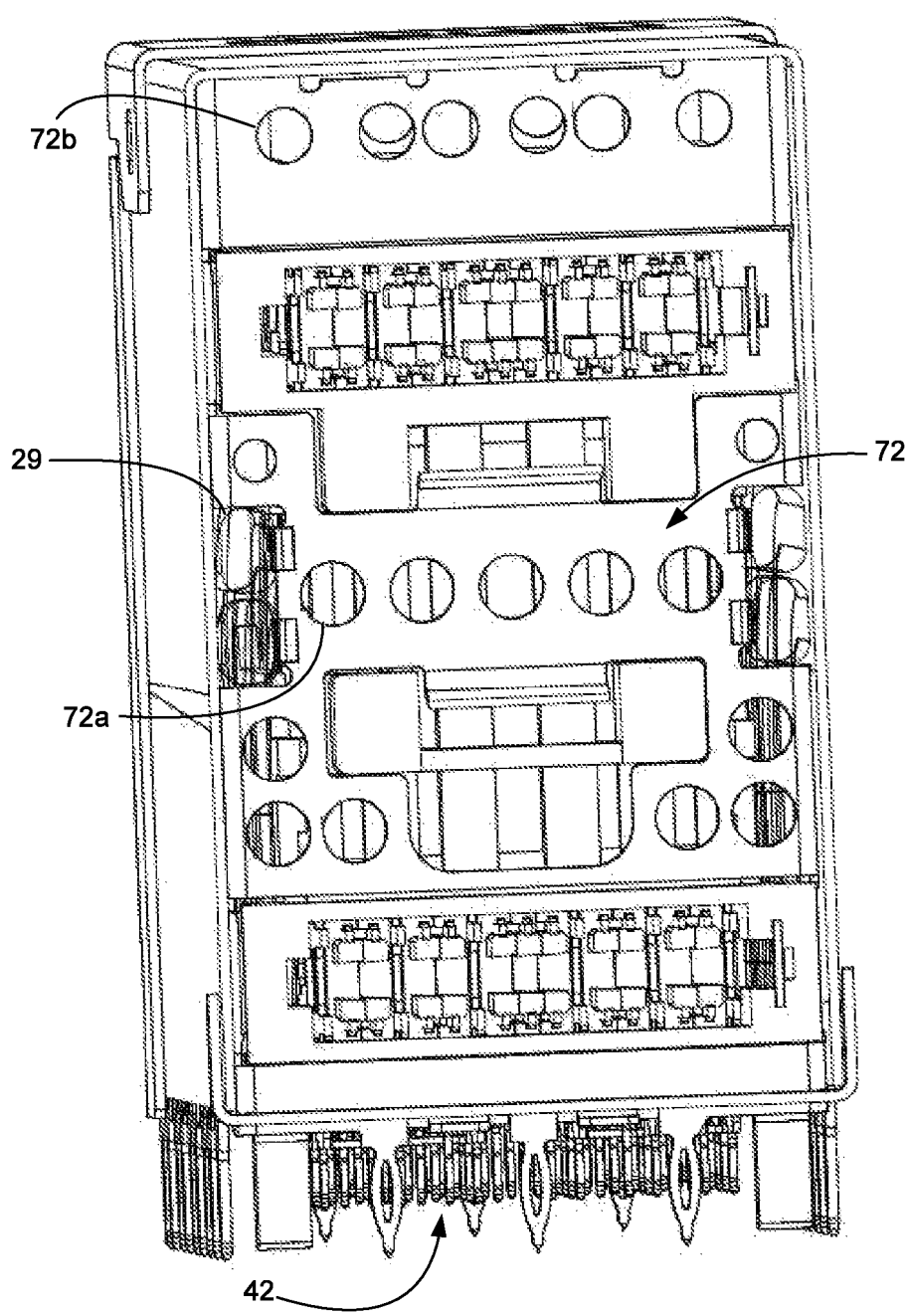
FIG. 17A illustrates a perspective view of the sectional taken along line 17-17 in FIG. 16A.
Figure 17B:
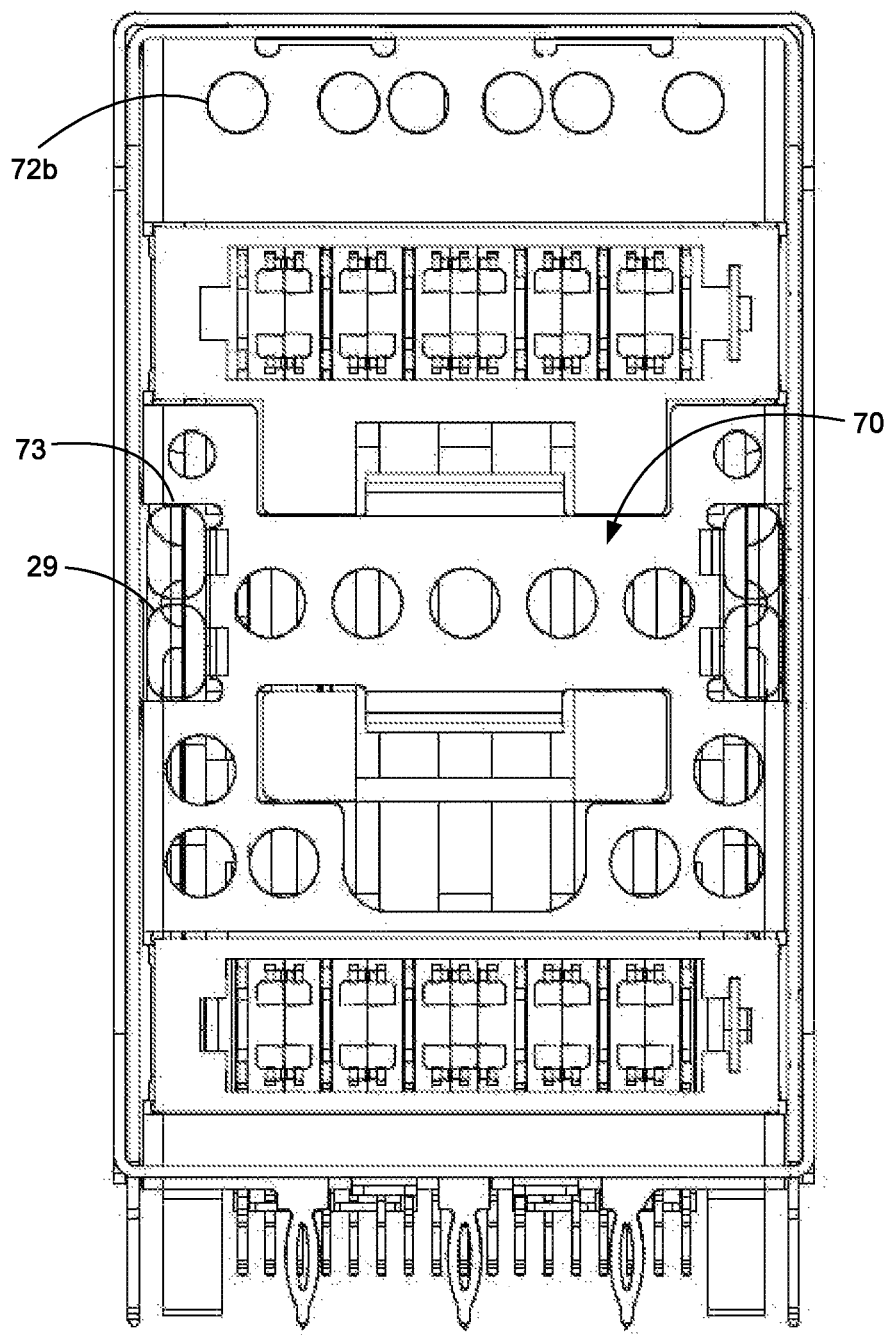
FIG. 17B illustrates an elevated front view of the embodiment depicted in FIG. 17A.
Figure 18:
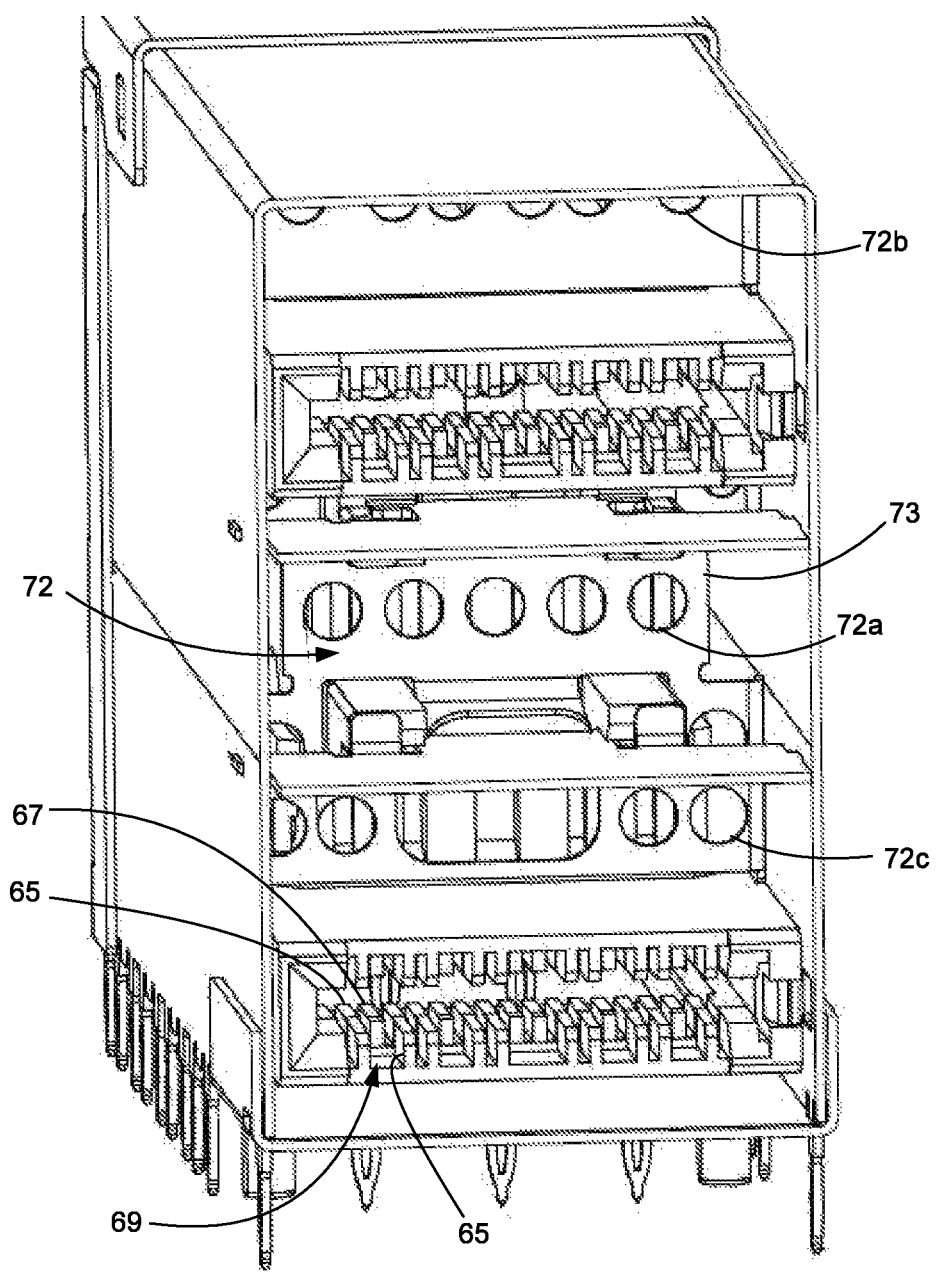
FIG. 18 illustrates a perspective view of the sectional taken along line 18-18 in FIG. 2.
Figure 19:
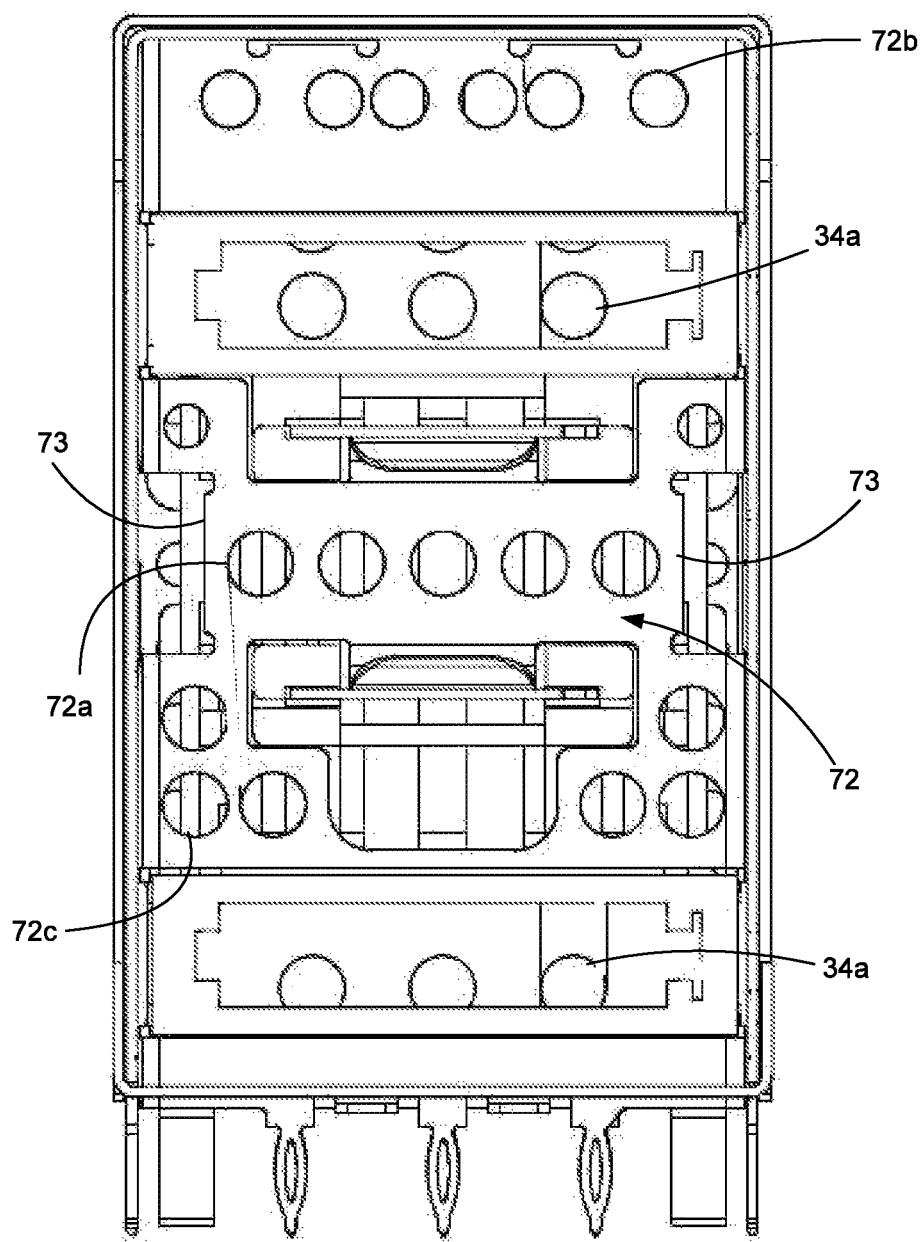
FIG. 19 illustrates a simplified elevated front view of the embodiment depicted in FIG. 18.
Figure 20:
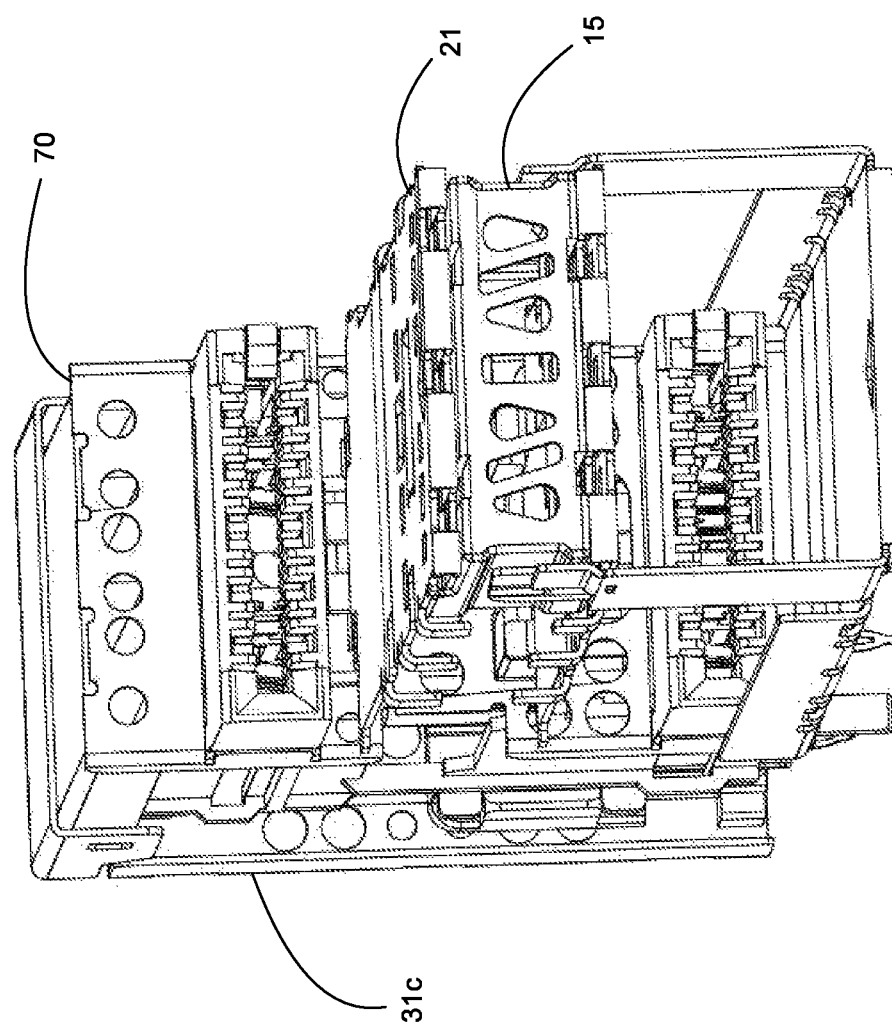
FIG. 20 illustrates a partial perspective view of an embodiment of a receptacle assembly.
Figure 21:
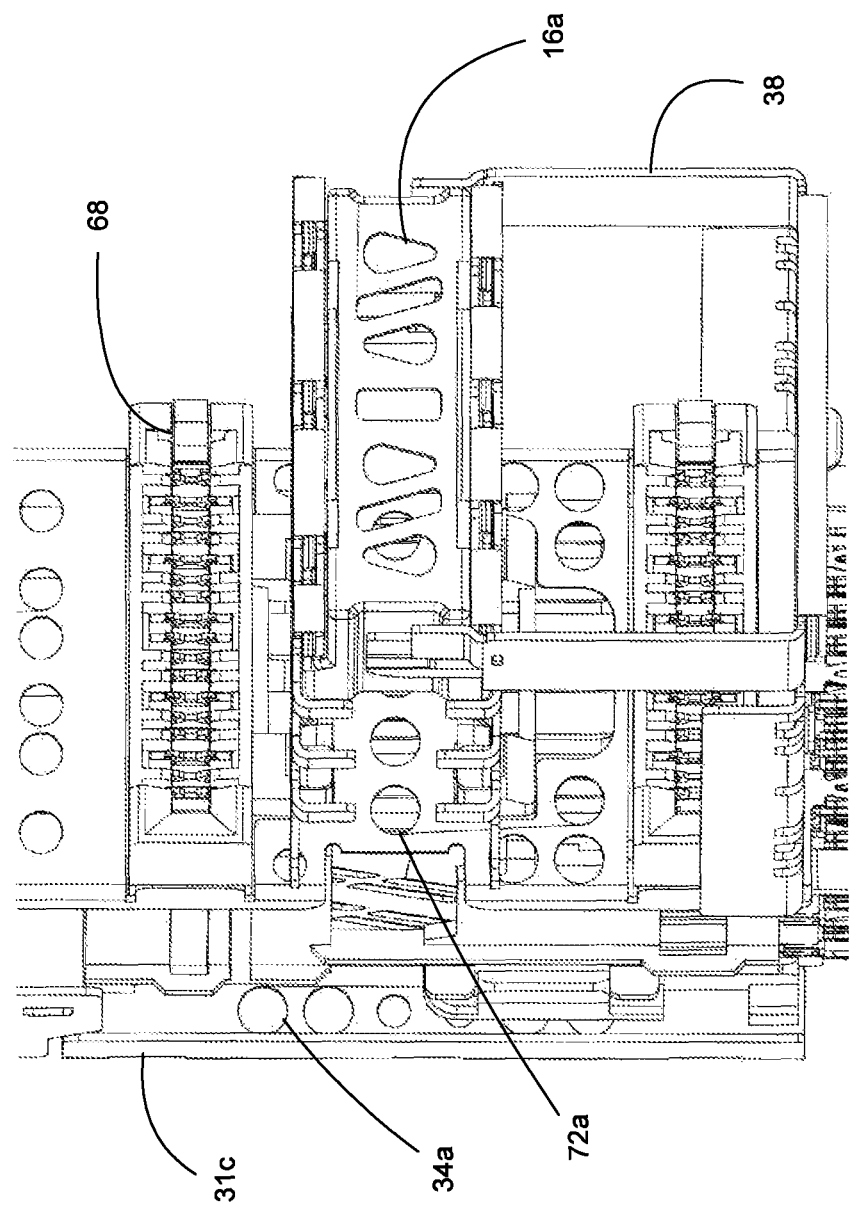
FIG. 21 illustrates another perspective view of the embodiment depicted in FIG. 20.

The detailed description that follows describes exemplary embodiments and is not intended to be limited to the expressly disclosed combination(s). Therefore, unless otherwise noted, features disclosed herein may be combined together to form additional combinations that were not otherwise shown for purposes of brevity. In addition, the depicted features may be used alone or in combination with a subset of the other depicted features so as to provide functionality that is appropriate for the corresponding application. Thus, the depicted embodiments are not intended to be limiting unless otherwise noted.

Turning to the FIGS., a connector assembly 10 is mounted on a circuit board 5. The connector assembly includes a cage 30 and has ports 12 that are configured to receive plug assemblies 90.

As is known, a plug assembly can include a cable 93 attached to a body 92 and the depicted embodiment includes a latch 91 that is configured to allow a latch system to releasably engage the receptacle assembly 10. Alternative embodiments of a plug assembly could include a body that does not have a cable attached to it (such as embodiments that provide for optical connectors that can plug into the plug assembly). The body 92 protects a paddle card 95 that can have pads on a 0.65 or 0.60 pitch and the paddle card 95 is part of the interface between the plug assembly 90 and the receptacle assembly 10. The depicted body 92 includes a surface 94 that includes cooling grooves 96 that extend substantially the length of the body that is intended to be inserted into the port 12 and in an embodiment extend along the top surface to an end 92a that is past the front 60a of the projection 60. The cooling grooves 96 allow air to flow through the port 12 when the plug assembly 90 is inserted into the port 12 and substantially improves cooling efficiency compared to prior art designs as the air flow is able to directly cool the plug assembly 90.

The receptacle assembly 10 includes a top wall 31a, two side walls 31b and a rear wall 31c. A bottom wall 31d can also be provided to improve shielding performance. A housing 50 is positioned in the cage and supports a wafer array 40. The housing 50 includes a projection 60 and a card slot 62 is provided in the projection 60. The card slot 62 includes a biasing element 68 that is configured to engage the paddle card 95 and bias the paddle card 95 to one side of the card slot 62. This allows for control of the paddle card 95 vis-a-vis the card slot and removes a range of tolerances that would otherwise be associated with the location of the pads on the paddle card 95 versus the location of contacts provided in the card slot 62. The housing 50, which can be formed of an insulative resin, further includes air channels 52 that allow for additional cooling and can have a back support 54 that snaps onto the housing 50 and helps secure the wafer array 40 in position.

As is known, the wafer array 40 includes a plurality of wafers 41 and each wafer 41 supports a plurality of terminals that each can have a tail 42 and a contact 44. The contacts 44 are positioned on in the card slot 62 and typically will be arranged so that some contacts are positioned on opposing sides of the card slot 62. To improve performance, short ribs 67 separate the signal terminals that form a differential pair 45 while long ribs are positioned between the signal terminal and the corresponding ground terminals. As the contacts 44 are positioned in a single row on a constant pitch, the short ribs 67 provide electrical isolation and protection between signal terminals while the long ribs 65 increase the dielectric contact between the signal terminals and the ground terminal compared to the dielectric constant associated with the signal terminals so as to provide preferential coupling between the differential pair (e.g., even though the terminals are on a constant pitch, more energy is carried in the differential coupling than symmetry would suggest). In other words, the ribs 65, 67 form grooves that help protect the contacts 44 and the signal terminals are aligned with a notch 69 formed in the card slot 62 that helps lower the dielectric constant near the signal terminal contacts.

The cage includes a front portion 32 that can provide structure support for the rest of the cage 30 and the front portion 32, which can include shoulders 38 that extend from the bottom wall 31d, can support an EMI gasket 32a that can be positioned in the ports and that helps minimize EMI radiation. Light pipes 29 can be provided (they are shown as being transparent like in the FIGS. as they often are transparent) and typically would be configured to direct light from the supporting circuit board toward a front face 11a, usually between the two ports.

To help define the ports 12, a central support 21 is provided. The central support 21 can be formed of a top wall 21a and a bottom wall 21b that are supported by the sides 31b and help define a bottom or top of a port, respectively. A central duct 26 is defined by the central support 21. The top and bottom walls 21a, 21b can include notches 23 to further allow airflow into the ports 12. An insert 15 can be positioned in the central support 21. The insert 15 includes a front wall 16 with front apertures 16a that allow air to flow through the front wall 16 and further allows for indicators that use light pipes to illuminate the corresponding area.

The connector assembly also includes a middle wall 70 that has middle array 72 with middle apertures 72a and further includes apertures 72b positioned in the top port 12 and includes apertures 72c positioned in the bottom port 12. The apertures 72a, 72b, 72c allow air to flow past the middle wall 70 while still providing desireable EMI protection. The middle wall 70 has cutouts 73 that allow the light pipes 29 to extend past the middle wall 70. Thus the depicted design allows for the use of light pipes while still providing improved cooling capabilities.

Rear apertures 34a allow air to flow past the rear wall 31c. The housing 50 is designed so that there is sufficient room on the side of the housing 50 so that air can flow past from the middle wall 70 to the rear wall 31c. As can be appreciated, therefore, the connector assembly 10 is configured to allow for substantial air flow to pass from the front face 11a to a rear face 11b (or in the opposite direction). Specifically, if air is flowing from the front face 11a to the rear face 11b then an insert 15 is configured to allow air to flow through the front wall 16, air flows through the central duct 26, then through a middle wall 70, past the housing 50 and finally out rear wall 31c.

As can be appreciated, a card slot is disclosed in the embodiments depicted that provides terminals at a 0.60 or 0.65 mm pitch. To provide for the necessary tolerances, the biasing element 68 is provided in the card slot and the biasing element 68 helps ensure the location of one side of the paddle card is known (one side is biased against one side of the card slot). This reduces the tolerance stack-up such that a 0.6 mm pitch connector is possible with a conventional paddle card based mating connector. Compared to prior art designs this provides a further improvement over biasing the entire plug connector as it has been determined that there is the potential for tolerance stack-up of the location of the paddle card 95 within the plug connector 90. The depicted embodiment, however, eliminates that form of tolerance stack-up as an edge 95a of the paddle card 95 becomes a datum. The tolerances can be further improved if the edge 95a of the paddle card 95 is used to align pads 97 that are positioned on the paddle card 95. Otherwise, the standard construction techniques used to form paddle cards would result in a tolerance stack-up that would prevent 0.6 mm pitch terminal from working in a reliable fashion.

It should be noted that if the terminals are on a larger pitch (such as 0.7 or more) then the biasing element can be omitted. The connector design still provides desirable cooling properties for what is otherwise a compact package and the cooling features can be incorporated into connectors regardless of the pitch of the terminals.

The cable assembly need not provide the cooling grooves in all situations. If, for example, the cable assembly is a passive device then there will be little need for cooling and the cooling grooves can be omitted.

The disclosure provided herein describes features in terms of preferred and exemplary embodiments thereof. Numerous other embodiments, modifications and variations within the scope and spirit of the appended claims will occur to persons of ordinary skill in the art from a review of this disclosure.

I claim:

1. A connector assembly, comprising:
    a receptacle with a cage that defines a port and a housing positioned in the cage, the cage having a rear wall and the housing having a card slot aligned with the port, the card slot having a plurality of terminals with contacts positioned in the card slot, the contacts forming a row, the card slot having a biasing element positioned on a first side of the card slot;
    a plug assembly positioned in the port, the plug assembly including a body and a paddle card with pads that engage the contacts, the paddle card having an edge that is pressed against a second side of the card slot, the first side being opposite the second side, the card slot extending between the first and second sides such that a top of the card slot and a bottom of the card slot are closer together than the first side is to the second side.

2. The assembly of claim 1, wherein the receptacle is a stacked connector and the port is a first port, the connector further including a second port arranged vertically over the first port, the housing further supporting a second card slot aligned with the second port, the second slot having a biasing element.

3. The assembly of claim 1, wherein the contacts are on a pitch that is between 0.59 mm and 0.66 mm.

4. The assembly of claim 1, wherein the pads are aligned with the edge of the paddle card.

5. The assembly of claim 1, wherein the plug assembly includes a first surface on the body and the first surface includes a plurality of cooling grooves configured to allow air to flow through the port while the plug assembly is positioned in the port and wherein the first surface includes a portion that is intended to be inserted into the port and the cooling grooves extend along the entire portion.

6. A connector system, comprising:
    a cage that includes a front face and a rear face and first port and a second port and a central duct between the two ports; and
    a first card slot aligned with the first port and a second card slot aligned with the second port, the first and second card slots each form openings that extend between opposite ends a greater distance than between top and bottom and are each configured to receive a paddle card,
    wherein the first card slot includes a first biasing member on a first end of the first card slot, the first biasing member configured to press an edge of a paddle card, when inserted into the first card slot, against an end of the card slot opposite the first end, and
    wherein the second card slot includes a second biasing member on a second end of the second card slot, the second biasing member configured to press an edge of a paddle card, when inserted into the second card slot, against an end of the card slot opposite the second end.

7. The connector system of claim 6, wherein the first card slot includes a plurality of terminals arranged on a pitch that is between about 0.6 mm and 0.65 mm.

8. The connector system of claim 6, further comprising a housing positioned in the cage, wherein the housing supports light pipes.

9. A receptacle, comprising:
    a cage defining a port and having a rear wall;
    a card slot positioned in the cage and being aligned with the port, the card slot forming an opening that extends between opposite ends of the card slot a greater distance than between a top and bottom of the card slot, the card slot being configured to receive a paddle card; and
    a plurality of terminals with contacts positioned in the card slot, the contacts forming a row,
    wherein the card slot includes a biasing member on a first end of the card slot, the biasing member configured to press an edge of a paddle card, when inserted into the card slot, against an end of the card slot opposite the first end.

10. The receptacle of claim 9, wherein the receptacle comprises a stacked connector and the port is a first port, the receptacle further including a second port arranged vertically over the first port and a second card slot aligned with the second port, the second card slot having a biasing element.

* * * * *